United States Patent
Sugahara

(10) Patent No.: US 8,033,648 B2
(45) Date of Patent: Oct. 11, 2011

(54) PATTERN FORMING APPARATUS AND PATTERN FORMING METHOD

(75) Inventor: Hiroto Sugahara, Aichi-ken (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 873 days.

(21) Appl. No.: 11/904,923

(22) Filed: Sep. 27, 2007

(65) Prior Publication Data
US 2008/0079890 A1     Apr. 3, 2008

(30) Foreign Application Priority Data
Sep. 29, 2006   (JP) .................................. 2006-268135

(51) Int. Cl.
*B41J 2/06* (2006.01)
(52) U.S. Cl. .......... 347/55; 347/111; 347/112; 347/153; 101/DIG. 37
(58) Field of Classification Search ................. 347/55, 347/111, 112, 153; 101/DIG. 37
See application file for complete search history.

(56) References Cited

U.S. PATENT DOCUMENTS

| | | | | |
|---|---|---|---|---|
| 4,263,601 A | * | 4/1981 | Nishimura et al. | 347/55 |
| 5,777,576 A | * | 7/1998 | Zur et al. | 347/120 |
| 2003/0085057 A1 | | 5/2003 | Hashimoto | |

FOREIGN PATENT DOCUMENTS

| | | |
|---|---|---|
| JP | 11163499 | 6/1999 |
| JP | 2000216330 | 8/2000 |
| JP | 2003142802 | 5/2003 |
| JP | 2003309085 | 10/2003 |
| WO | WO 2006/008736 | 1/2006 |

OTHER PUBLICATIONS

XP011123267—Hagberg J et al: Direct Gravure Printing (DGP) Method for Printing Fine-Line Electrical Circuits on Ceramics IEEE Transactions on Electronics Packing vol. 27, No. 2, Apr. 1, 2004 pp. 109-114.
XP002350486—Hagerg J et al: "Gravure Offset Printing Development for fine line thick flim circuits" Microelectronics International, GB, v18, n3, Sep. 1, 2001, pp. 32-35.

* cited by examiner

*Primary Examiner* — Elena T Lightfoot
(74) *Attorney, Agent, or Firm* — Frommer Lawrence & Haug LLP

(57) ABSTRACT

A pattern forming apparatus which forms a pattern of an electroconductive liquid on a printing medium includes a pattern forming substrate having an insulating substrate, a plurality of electrodes arranged on the insulating substrate, and an insulating layer which covers the electrodes, an electric potential controller which selectively applies an electric potential to the electrodes, and a transferring mechanism which transfers the pattern by bringing the electroconductive liquid formed as a predetermined pattern on the insulating layer, in contact with the printing medium. Accordingly, it is possible to form a fine pattern at a low cost.

15 Claims, 17 Drawing Sheets

PATTERN FORMING APPARATUS AND PATTERN FORMING METHOD

CROSS REFERENCE TO RELATED APPLICATION

The present application claims priority from Japanese Patent Application No. 2006-268135 filed on Sep. 29, 2006, the disclosure of which is incorporated herein by reference in its entirety.

BACKGROUND OF THE INVENTION

1. Field of the Invention

The present invention relates to a pattern forming apparatus which includes a pattern forming substrate, on a surface of which a predetermined pattern is formed, and a pattern forming method in which a predetermined pattern of an electroconductive liquid is formed on a printing medium.

2. Description of the Related Art

An ink-jet printer which includes an ink-jet head which jets an ink, and inside of which, a plurality of ink channels including nozzles which jet the ink, and pressure chambers which communicate with the nozzles is formed, and piezoelectric actuators are arranged at a position facing the pressure chambers respectively is available. In such ink-jet printer, each of the actuators is connected to a driver IC. Moreover, when each of the actuators are driven based on a driving signal which is output from the driver IC, a volume of the corresponding pressure chamber is changed, and a jetting energy is imparted to the ink in the pressure chamber. Accordingly, the ink is jetted from the nozzle communicating with the pressure chamber.

In recent years, due to an improvement in a printing speed and a printing quality, a degree of integration of the actuator in the ink-jet printer mentioned above, is becoming higher year by year. With this, it is necessary to make small a pitch of a wiring which connects electrodes on the actuator and terminals of the driver IC. Consequently, forming of a wiring pattern of a small (fine) pitch at a low cost has been sought.

In FIG. 5 of Japanese Patent Application Laid-open No. 11-163499, a method (an ink-jet method) of forming a wiring pattern on a substrate by jetting from an ink-jet printer, an electroconductive ink which is a material for forming wires has been disclosed as a technology for forming a wiring pattern at a low cost.

SUMMARY OF THE INVENTION

Here, for example, in an ink-jet printer in which 1200 actuators are arranged in a width of 1 inch, for connecting the electrodes on the actuators and the connecting terminals of the driver IC by a flexible printed circuit (FPC) of 1 inch width, it is necessary to carry out wiring with a wiring of a fine pitch of 20 µm or less. However, in a case of manufacturing the FPC by using the abovementioned ink-jet method, the wiring pitch which can be possibly made is limited to about 40 µm. Moreover, even in electronic equipments other than the ink-jet head, forming of a fine pitch wiring on a wiring substrate and a circuit substrate has been sought.

In view of this, an object of the present invention is to provide a pattern forming apparatus which is capable of forming a fine pattern at a low cost, and a pattern forming method.

According to a first aspect of the present invention, there is provided a pattern forming apparatus which forms a predetermined pattern of an electroconductive liquid on a printing medium, the apparatus comprising:

a pattern forming substrate which includes an insulating substrate and a plurality of electrodes arranged on the substrate;

an electric potential applying mechanism which selectively applies a first electric potential and a second electric potential to each of the plurality of electrodes, a first electric potential making overlapping areas, of a surface of the pattern forming substrate, which overlap with the plurality of electrodes respectively, have a first liquid repellent property, and a second electric potential making the overlapping areas to have a second liquid repellent property which is lower than the first liquid repellent property;

an electric potential controller which controls the electric potential applying mechanism to apply the second electric potential to certain electrodes, among the plurality of electrodes, corresponding to the pattern, and to apply the first electric potential to another electrodes, among the plurality of electrodes, not overlapping with the pattern; and a transferring mechanism which transfers, to the printing medium, the electroconductive liquid which is arranged to form the predetermined pattern on the surface of the pattern forming substrate, by bringing the electroconductive liquid into contact with the printing medium.

According to the first aspect of the present invention, since the pattern forming substrate has the electrodes arranged on the substrate which is non-electroconductive (insulating), and the electroconductive liquid arranged (placed) on the surface of the pattern forming substrate is let to be the desired pattern on the surface, it is possible to apply selectively the first electric potential and the second electric potential to these electrodes. At this time, due to an electrowetting phenomenon, it is possible to change the liquid repellent property of the overlapping area of the pattern forming substrate, which overlaps with the electrodes, between the first liquid repellent property and the second liquid repellent property. In this manner, since it is possible to adjust the liquid repellent property of the overlapping area according to the electric potential applied to the electrodes, it is possible to adjust the pattern of the electroconductive liquid which is spread by wetting on the surface of the pattern forming surface. For example, by arranging the electrodes finely (very closely), it is possible to form a fine pattern of the electroconductive liquid on the surface of the pattern forming substrate, and by transferring the pattern to the printing medium, it is possible to form the fine pattern on the printing medium.

Here, the 'first electric potential' and the 'second electric potential' may be values in a fixed range, and not values which are determined uniquely. However, in this case, the range of the values which may be taken by the first electric potential and the second electric potential do not overlap. Moreover, the 'electroconductive liquid' is not a liquid restricted to a liquid having a comparatively high electroconductivity, such as a liquid in which, nano electroconductive particles of copper etc. are dispersed, but may be a liquid which contains an 'electroconductive liquid' for which the electrowetting phenomenon occurs, such as an aqueous solution. Furthermore, the 'surface of the pattern forming substrate' means a surface of the pattern forming substrate, on a side on which the electrodes are arranged with respect to the substrate.

In the pattern forming apparatus of the present invention, the plurality of electrodes may be mutually isolated on the substrate, may be arranged in a regular manner, and may have shapes which are same among the electrodes.

In this case, since the electrodes are mutually isolated on the substrate, and are arranged regularly, and have the same shape, it is possible to form easily the pattern of the electroconductive liquid having a predetermined shape, on the surface of the pattern forming substrate.

In the pattern forming apparatus of the present invention, after the transferring mechanism brings the electroconductive liquid arranged to form the pattern into contact with the printing substrate, the electric potential controller may apply the first electric potential to the certain electrodes corresponding to the pattern.

In this case, since the liquid repellent property of the overlapping area of the surface of the pattern forming substrate, corresponding to the pattern is improved by letting the potential of the electrodes corresponding to the desired pattern to be the first electric potential, the electroconductive liquid formed as the desired pattern is transferred assuredly to the printing medium.

Furthermore, in the pattern forming apparatus of the present invention, the first liquid repellent property of the overlapping areas corresponding to the certain electrodes, to which the first electric potential is applied by the electric potential applying mechanism, may be greater than a liquid repellent property of the printing medium.

In this case, since the liquid repellent property of the overlapping area (facing area facing the electrodes) of the surface of the pattern forming substrate, corresponding to the pattern is superior to the liquid repellent property of the printing medium, it is possible to transfer the electroconductive liquid assuredly to the printing medium.

In the pattern forming apparatus of the present invention, the electric potential controller may control the electric potential applying mechanism to apply the second electric potential to intermediate pattern-electrodes, among the plurality of electrodes, corresponding to an intermediate pattern, and to apply the first electric potential to non-overlapping electrodes, among the plurality of electrodes, not overlapping with the intermediate pattern before the electric potential controller controls the electric potential applying mechanism to arrange the electroconductive liquid to form the pattern on the surface, the intermediate pattern having an intermediate shape between the initial pattern and the pattern.

In this case, by having the intermediate pattern, it is possible to let the electroconductive liquid arranged on the surface of the pattern forming substrate to be the desired pattern smoothly.

The pattern forming apparatus of the present invention may further include a liquid supplying mechanism which supplies the electroconductive liquid to the surface of the pattern forming substrate. In this case, since the pattern forming apparatus includes the liquid supplying mechanism, it is possible to arrange easily the electroconductive liquid on the surface of the pattern forming substrate.

In the pattern forming apparatus of the present invention, a through hole may be formed through the pattern forming substrate, the through hole having an opening on the surface of the pattern forming substrate; and the liquid supplying mechanism may supply, via the through hole, the electroconductive liquid to the surface of the pattern forming substrate.

In this case, since the electroconductive liquid is supplied to the surface of the pattern forming substrate via the through hole, it is not necessary to move the pattern forming substrate up to a position which is not directly beneath the printing medium, and it is possible to reduce (make small) a size of the apparatus.

In the pattern forming apparatus of the present invention, the electric potential controller may control the electric potential applying mechanism to apply the second electric potential to a initial pattern-electrodes, among the plurality of electrodes, corresponding to a predetermined initial pattern and to apply the first electric potential to non-overlapping electrodes, among the plurality of electrodes, not overlapping with the initial pattern so as to arrange the electroconductive liquid, supplied to the surface of the pattern forming substrate by the liquid supplying mechanism, is first arranged to form the initial pattern.

When the electroconductive liquid is arranged (placed) on the surface of the patent forming substrate, in a case in which, a liquid repellent property of the surface is comparatively higher over the entire surface, there is a possibility that the electroconductive liquid flows over the surface due to vibrations of the pattern forming substrate, and falls from the surface. Moreover, when the liquid repellent property of the surface is comparatively lower over the entire surface, the electroconductive liquid is spread on the surface wetting the surface. According to the abovementioned structure, it is possible to accumulate the liquid in an area on the surface of the pattern forming substrate, corresponding to a predetermined initial pattern. Consequently, thereafter, it is possible to change smoothly the electroconductive liquid into a different pattern.

In the pattern forming apparatus of the present invention, the electric potential controller may control the electric potential applying mechanism to apply the second electric potential to a group of electrodes, located at a central portion among the plurality of electrodes, and to apply the first electric potential to remaining electrodes, not belonging to the group of electrodes, so that the electroconductive liquid is arranged to form the initial pattern.

In this case, it is possible to accumulate the electroconductive liquid at the central portion of the pattern forming substrate. Consequently, thereafter, it is possible to change smoothly the electroconductive liquid into a different pattern.

In the pattern forming apparatus of the present invention, the liquid supplying mechanism may be capable of supplying the electroconductive liquid in a supply amount in accordance with the pattern; and the electric potential controller may control the electric potential applying mechanism such that a number of the initial pattern-electrodes to which the second electric potential is applied is increased when the supply amount of the electroconductive liquid is increased, and that a number of the non-overlapping electrodes to which the first electric potential is applied is decreased when the supply amount of the electroconductive liquid is increased.

For example, at the time of letting the electroconductive liquid arranged on the surface of the pattern forming substrate to be the intermediate pattern or the initial pattern, when an area of the pattern is too small corresponding to the amount of the electroconductive liquid, the liquid spreads out from the area corresponding to the pattern. On the other hand, when the area of the pattern is too large corresponding to the amount of the electroconductive liquid, it is not possible to form the pattern by the electroconductive liquid. According to the abovementioned structure, it is possible to let the electroconductive liquid be spread over the entire area without the electroconductive liquid being spread out from the area corresponding to the electrodes to which the second electric potential is applied by the electric potential applying mechanism.

In the pattern forming apparatus of the present invention, the pattern forming substrate may further include an insulating layer which covers the plurality of electrodes. When the electrodes are covered by the insulating layer, as compared to a case in which the electrodes are not covered by the insulating layer, a difference between a liquid repellent property (first liquid repellent property) of the overlapping area when the first electric potential is applied by the electric potential applying mechanism, and a liquid repellent property (second liquid repellent property) of the overlapping area when the second electric potential is applied by the electric potential applying mechanism becomes substantial. Consequently, according to the abovementioned structure, it is possible to improve a response at the time of letting the electroconductive liquid arranged on the insulating layer which is the surface of the pattern forming substrate, to be the desired pattern (initial pattern and intermediate pattern) by the electric potential controller.

In the pattern forming apparatus of the present invention, a through hole may be formed in the pattern forming substrate, the through hole penetrating through the substrate and the insulating layer, and having an opening on the insulating layer. In this case, it is possible to improve a response of the electroconductive liquid, and to supply the electroconductive liquid via the through hole.

In the pattern forming apparatus of the present invention, the electrodes may be arranged in a matrix form on the substrate. In this case, it is possible to form a two-dimensional pattern by transferring once.

In the pattern forming apparatus of the present invention, the electrodes may be flat plates, and the electrodes may be arranged in the same plane. In this case, as compared to a case in which the electrodes are arranged on a surface having irregularities, the manufacturing becomes easier.

In the pattern forming apparatus of the present invention, a plurality of recesses may be formed in a recessed shape corresponding to the recesses, respectively. In this case, the liquid which is arranged (placed) on the surface of the pattern forming substrate, and spread on a facing area corresponding to the electrodes let to be at the second electric potential is stable without being spread out from the facing area. Consequently, a performance (capability) of liquid pattern formation is improved.

The pattern forming apparatus of the present invention may further include a movable mechanism which has the pattern forming substrate provided thereon, and which is movable between the liquid supplying mechanism and the transferring mechanism.

In this case, for example, even when the liquid supplying mechanism supplies the liquid to the surface of the pattern forming substrate by dripping the liquid from a liquid dripping unit which is arranged above the pattern forming substrate, the pattern forming apparatus, at the time of transferring the liquid, is capable of making an arrangement such that the pattern forming substrate is positioned directly beneath the printing medium, and at the time of arranging the electroconductive liquid on the surface of the pattern forming substrate, the pattern forming substrate is removed from beneath the printing medium, and is moved up to a position directly beneath the liquid dripping unit.

According to a second aspect of the present invention, there is provided a pattern forming method which is a method for forming a pattern of an electroconductive liquid on a printing medium, including:

providing a pattern forming substrate which includes a substrate having an insulating property and a plurality of electrodes arranged on the substrate;

placing the electroconductive liquid on a surface of the pattern forming substrate;

arranging the electroconductive liquid, placed on the surface of the pattern forming substrate, to form the pattern by selectively applying a second electric potential to certain electrodes, among the plurality of electrodes, corresponding to the pattern and a first electric potential to another electrodes, among the plurality of electrodes, not overlapping with the pattern, the first electric potential making facing areas, of a surface of the pattern forming substrate, facing the plurality of electrodes respectively have a first liquid repellent property and the second electric potential making the facing areas have a second liquid repellent property which is lower than the first liquid repellent property; and transferring the electroconductive liquid, which is arranged on the surface of the pattern forming substrate to form the pattern, onto the printing medium by bringing the electroconductive liquid into contact with the printing medium.

According to the second aspect of the present invention, since it is possible to form the pattern on the printing medium only by arranging (placing) the electroconductive liquid, applying the electric potential to the electrodes, and transferring the pattern formed to the printing medium, the pattern is formed at a low cost.

In the pattern forming method of the present invention, the plurality of electrodes may be arranged on the substrate in a regular manner to be mutually isolated on the substrate, and may have shapes which are same among the electrodes.

In this case, since the electrodes are mutually isolated on the substrate, and are arranged regularly, and have the same shape, it is possible to form easily a pattern of the electroconductive liquid having a predetermined shape.

In the pattern forming method of the present invention, the placing of the electroconductive liquid on the surface of the pattern forming substrate, the application of the first electric potential and the second electric potential to the plurality of electrodes, and the transfer of the electroconductive liquid, arranged to form the pattern, to the printing medium may be performed in this order for a plurality of times. In this case, it is possible to form a pattern larger than an area of the surface of the pattern forming substrate on which the electroconductive liquid is arranged, on the printing medium.

In the pattern forming method of the present invention, the first liquid repellent property of the facing areas corresponding to the another electrodes to which the first electric potential is applied may be higher than a liquid repellent property of the printing medium; and when the electroconductive liquid arranged to form the pattern is transferred to the printing medium, the certain electrodes corresponding to the pattern may be made to have the first electric potential after bringing the electroconductive liquid arranged to form the pattern in contact with the printing medium. In this case, since the liquid repellent property of the overlapping area corresponding to the pattern, on the surface of the pattern forming substrate is improved by letting the electric potential of the electrodes corresponding to the desired pattern to be the first electric potential, the electroconductive liquid formed as the desired pattern is transferred assuredly to the printing medium. Moreover, since the liquid repellent property of the overlapping area (facing area facing the electrodes) corresponding to the pattern is superior to the liquid repellent property of the printing medium, it is possible to transfer assuredly the electroconductive liquid to the printing medium.

In the pattern forming method of the present invention, when the first and second electric potentials may be applied to the plurality of electrodes, intermediate pattern-electrodes, among the plurality of electrodes, corresponding to an intermediate pattern have the second electric potential, and to make non-overlapping electrodes, among the plurality of electrodes, not overlapping with the intermediate pattern have the first electric potential before arranging the electroconductive liquid to form the pattern on the surface. In this case, by having the intermediate pattern, it is possible to let the electroconductive liquid arranged on the surface of the pattern forming substrate to be a desired pattern smoothly.

In the pattern forming method of the present invention, when the first and second electric potentials are applied to the plurality of electrodes, initial pattern-electrodes, among the plurality of electrodes, corresponding to a predetermined initial pattern may be made to have the second electric potential and non-overlapping electrodes not overlapping with the initial pattern may be made to have the first electric potential so that the electroconductive liquid, placed on the surface of the pattern forming substrate, is first arranged to form the initial pattern. In this case, it is possible to accumulate the electroconductive liquid in an area on the surface of the pattern forming substrate, corresponding to the predetermined initial pattern, and thereafter, to change smoothly the electroconductive liquid into a different pattern.

In the pattern forming method of the present invention, when the first and second electric potentials are applied to the plurality of electrodes, a group of electrodes, located at a central portion among the plurality of electrodes, may be made to have the second electric potential and remaining electrodes, not belonging to the group of electrodes, may be made to have the first electric potential so that the electroconductive liquid is arranged to form the initial pattern. In this case, it is possible to accumulate the electroconductive liquid at the central portion of the surface of the pattern forming substrate, and thereafter, to change smoothly the electroconductive liquid into a different pattern.

In the pattern forming method of the present invention, when the electroconductive liquid is placed on the surface of the pattern forming substrate, the electroconductive liquid may be supplied on the surface of the pattern forming substrate in a supply amount in accordance with the pattern; and a number of the initial pattern-electrodes to which the second electric potential is applied may be increased when the supply amount of the electroconductive liquid is increased, and a number of the non-overlapping electrodes to which the first electric potential is applied may be decreased when the supply amount of the electroconductive liquid is increased. In this case it is possible to let the electroconductive liquid be spread on the entire surface of the area without the electroconductive liquid being spread out from the area corresponding to the electrodes to which the second electric potential is applied.

In the pattern forming method of the present invention, the pattern forming substrate may further include an insulating layer which covers the plurality of electrodes. When the electrodes are covered by the insulating layer, as compared to a case in which the electrodes are not covered by the insulating layer, a difference between a liquid repellent property of the overlapping area when the first electric potential is applied by the electric potential applying mechanism, and a liquid repellent property of the overlapping area when the second electric potential is applied by the electric potential applying mechanism becomes substantial. Consequently, according to the abovementioned structure, it is possible to improve a response at the time of letting the electroconductive liquid arranged on the insulating layer which is the surface of the pattern forming substrate, to be the desired pattern (initial pattern and intermediate pattern) by the electric potential controller.

DETAILED DESCRIPTION OF THE PREFERRED EMBODIMENTS

Figure 1:
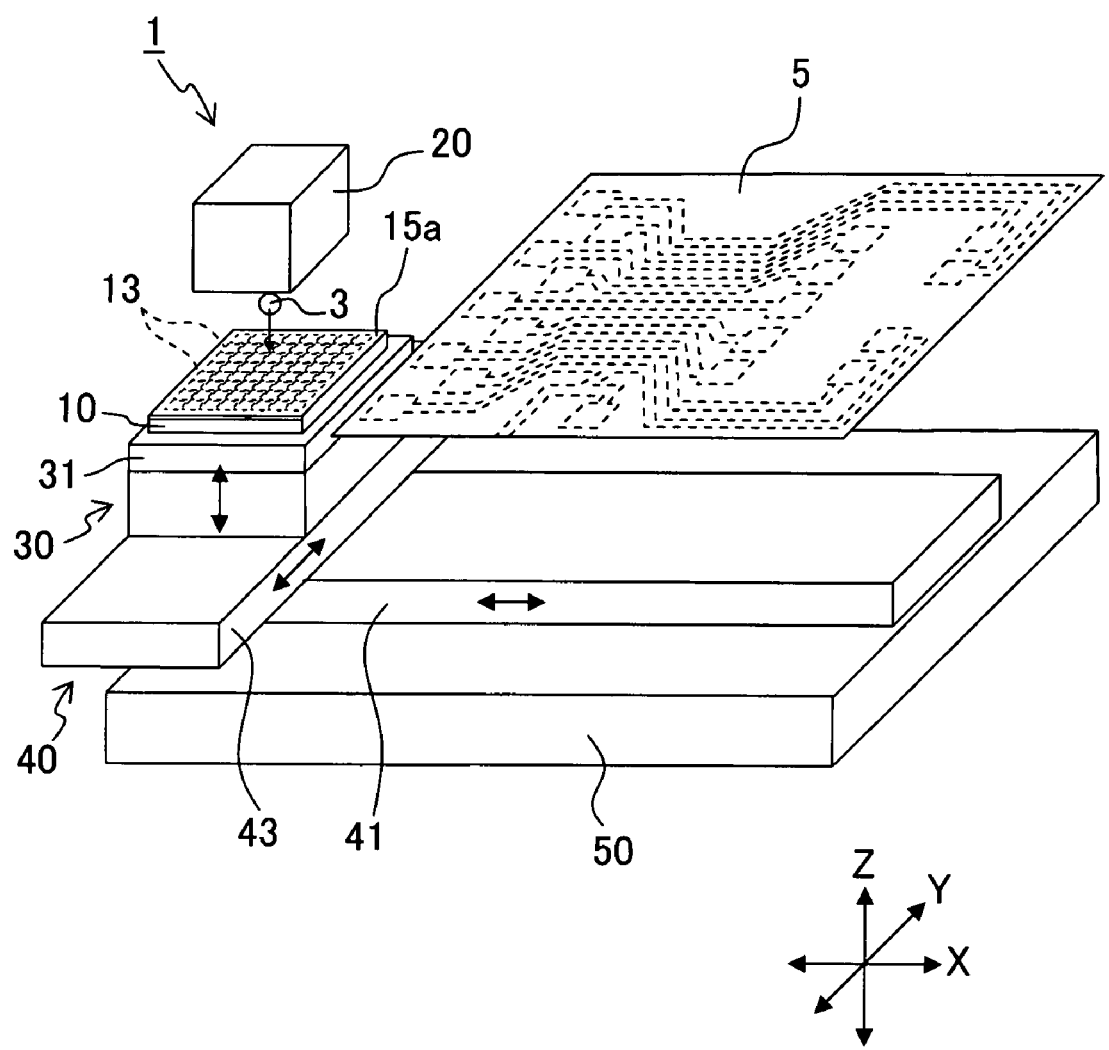
FIG. 1 is a diagram showing a schematic structure of a pattern forming apparatus according to a first embodiment of the present invention.

The exemplary embodiments of the present invention will be described below with reference to the accompanying diagrams. FIG. 1 is a diagram showing a schematic structure of a pattern forming apparatus according to a first embodiment of the present invention.

As shown in FIG. 1, a pattern forming apparatus 1 of the first embodiment mainly includes a pattern forming substrate 10, a printing head 20, a transfer mechanism 30, moving mechanism 40, and a base 50. The pattern forming substrate 10 has a pattern forming surface 15a which is horizontal. The printing head 20 drops an electroconductive liquid 3 on the pattern forming surface 15a of the pattern forming substrate 10. The transfer mechanism 30 brings the electroconductive liquid 3 on the pattern forming surface 15a in contact with a printing medium 5 by supporting and displacing the pattern forming substrate 10 in a perpendicular direction (vertical direction in FIG. 1). The moving mechanism 40 moves the pattern forming substrate 10 in a horizontal plane. The base 50 supports the moving mechanism 40. Moreover, the pattern forming apparatus 1 is controlled by a controller 60 (refer to FIG. 4) which will be described later. The electroconductive liquid 3 includes a liquid which contains a comparatively highly electroconductive liquid in which nano electroconductive particles of a material such as copper are dispersed, and in the first embodiment the electroconductive liquid 3 is kept all the time at a ground electric potential. Moreover, in the first embodiment, the printing medium 5 is a polyimide film.

Figure 2:
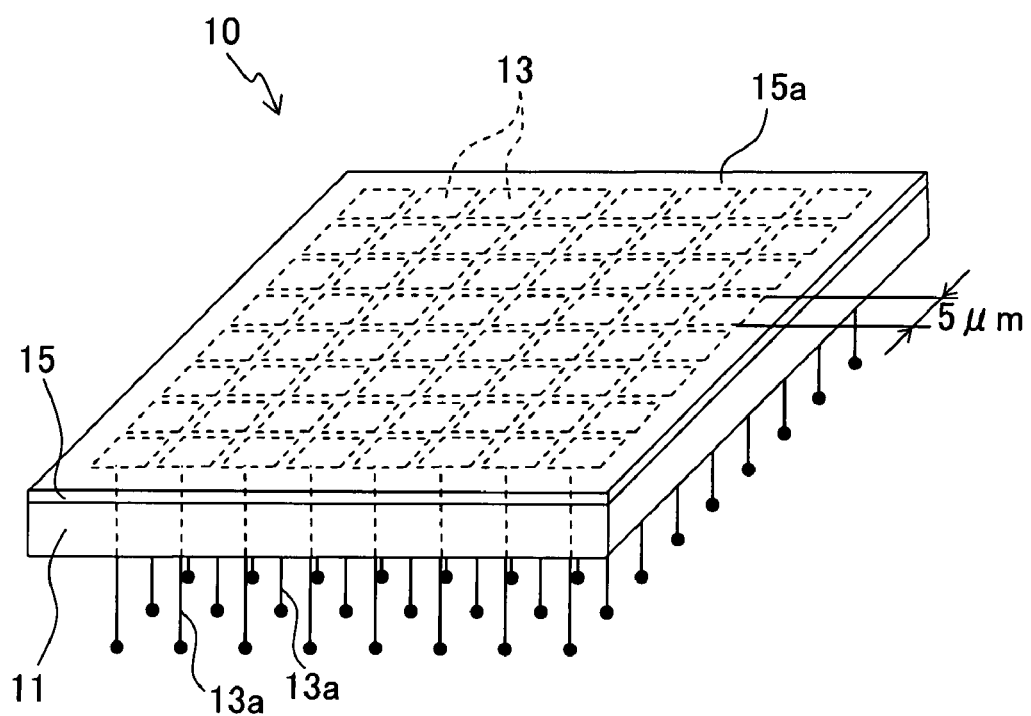
FIG. 2 is a perspective view of a pattern forming substrate shown in FIG. 1.
Figure 3A:
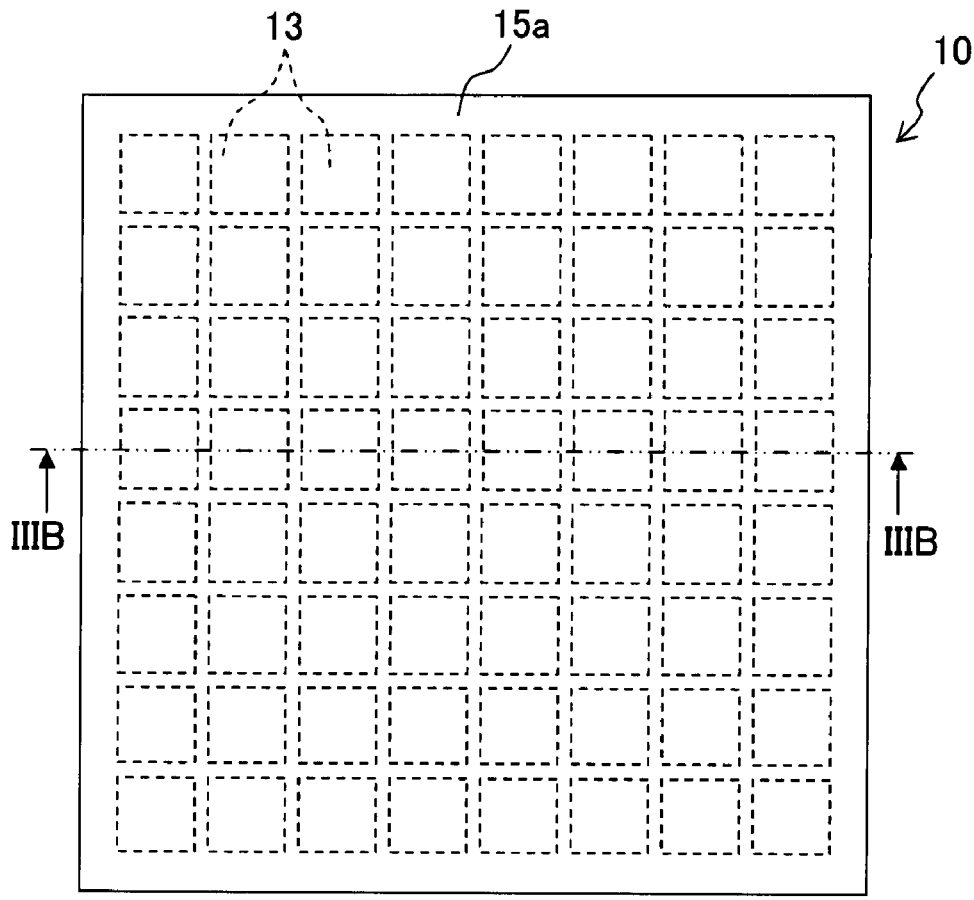
FIG. 3A is a top view of the pattern forming substrate shown in FIG. 1.
Figure 3B:
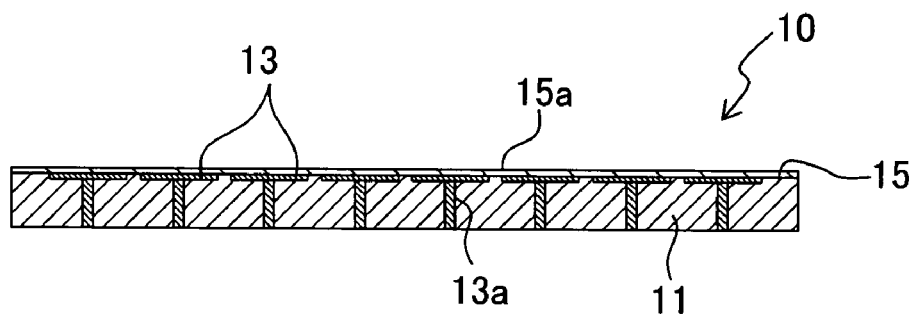
FIG. 3B is a cross-sectional view taken along a line IIIB-IIIB in FIG. 3A.

Here, the pattern forming substrate 10 will be described in detail with reference to FIGS. 2, 3A, and 3B. FIG. 2 is a perspective view of the pattern forming substrate 10, FIG. 3A is a top view of FIG. 2, and FIG. 3B is a cross-sectional view along a line IIIB-IIIB in FIG. 3A. As shown in FIGS. 2, 3A, and 3B, the pattern forming substrate 10 is a substantially square-shaped plate member, and includes a substrate 11 which is non-electroconductive, a plurality of electrodes 13 arranged to be mutually separated on the substrate 11, and an insulating layer 15 which covers the electrodes 13. Moreover, a surface, of the pattern forming substrate 10, on a same side of the substrate 11 on which the electrodes 13 are arranged, in other words, a surface of the insulating layer 15 is the pattern forming surface 15a. In the first embodiment, the insulating layer 15 is made of a fluororesin.

The electrodes 13 are flat plate electrodes having a substantially square shape, and are arranged in a matrix form on a plane parallel to the pattern forming surface 15a. In the first embodiment, a length of the electrode 13 is 5 μm. The electrodes 13 are electrically connected to a driver IC 14 (refer to FIG. 4) via wires 13a. Moreover, an electric potential signal is supplied to each electrode 13 by the driver IC 14. This electric potential signal is a pulse-array signal which alternately takes a ground electric potential and a predetermined positive electric potential. A magnitude of the positive electric potential of the electric potential signal which is supplied by the driver IC 14 is not less than a predetermined value at which an electrowetting phenomenon which will be described later, occurs.

With the electroconductive liquid 3 which is kept at the ground electric potential dropped on the pattern forming surface 15a, an electric potential of the electrode 13 positioned in a predetermined area is let to be a positive electric potential, and an electric potential of the electrode 13 positioned in an area other than a predetermined area is let to be the ground electric potential. Due to the electrowetting phenomenon, in an area, on the pattern forming surface 15a, facing the electrode 13 which is let to be at the positive electric potential, a contact angle of the electroconductive liquid 3 with respect to the pattern forming surface 15a becomes smaller. In other words, a liquid repellent property (first liquid repellent property) of an area to which the voltage is applied is degraded (becomes inferior) as compared to a liquid repellent property (second liquid repellent property) of an area facing the electrodes 13 which are let to be at the ground electric potential (a non-voltage applied area, in other words an area in which there is no electric potential difference between the electrode 13 and the electroconductive liquid 3). Consequently, the electroconductive liquid 3 on the pattern forming surface 15a moves to the predetermined area (a voltage applied area). Here, in the first embodiment, the liquid repellent property of the non-voltage applied area of the pattern forming surface 15a is superior to a liquid repellent property of the printing medium 5.

As shown in FIG. 1, the printing head 20 is held by a holding mechanism which is not shown in the diagram, and drops the electroconductive liquid 3 on the pattern forming surface 15a of the pattern forming substrate 10 positioned directly beneath the printing head 20. The printing head 20, as it will be described later, drops on the pattern forming surface 15a, an amount of the electroconductive liquid 3 corresponding to a pattern to be transferred to the printing medium 5.

Figure 4:
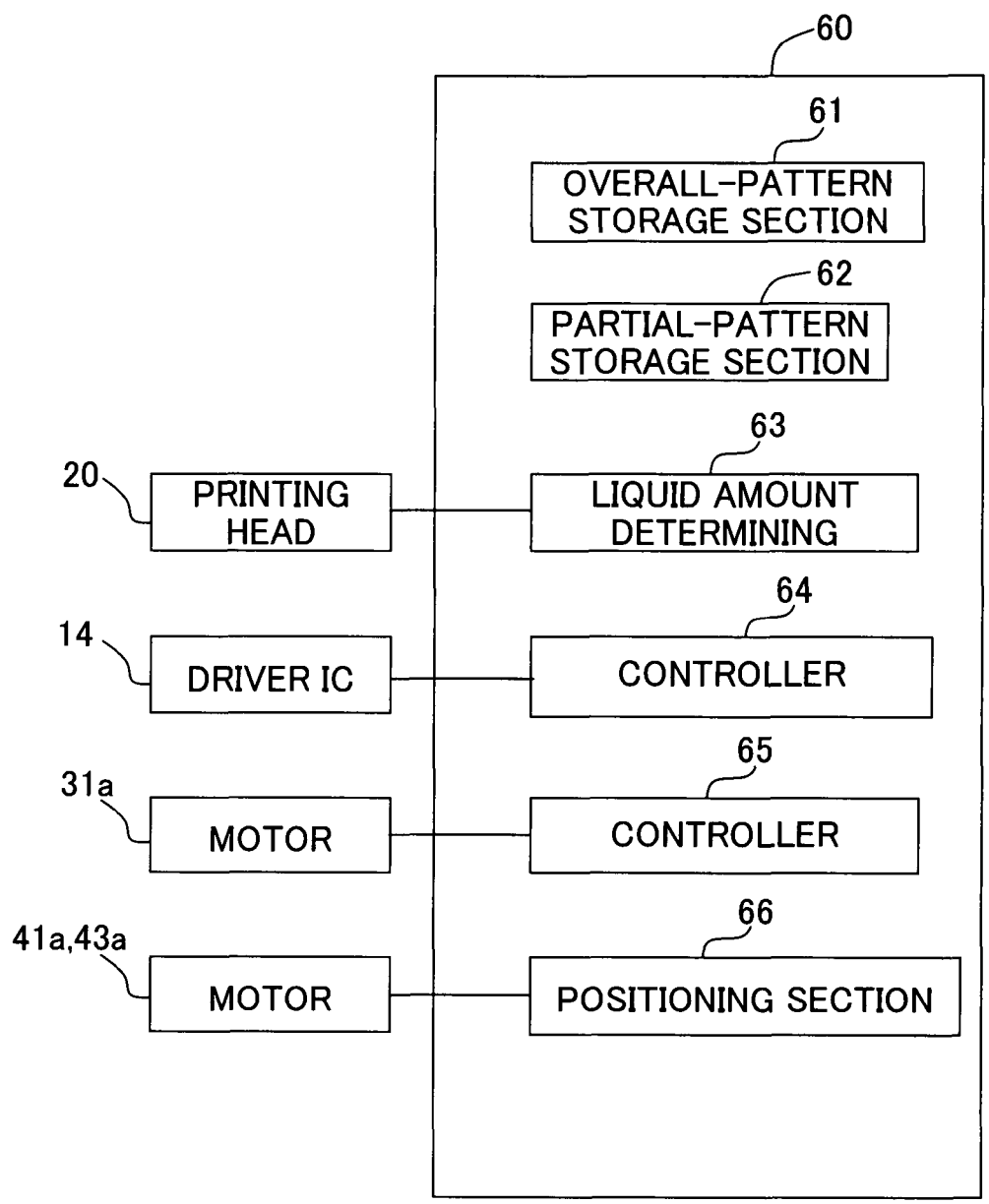
FIG. 4 is a block diagram showing a schematic structure of a controller which controls the pattern forming apparatus shown in FIG. 1.

The transfer mechanism 30 includes a Z direction moving stage 31 which is movable in a perpendicular direction (Z direction) by a motor 31a (refer to FIG. 4). The pattern forming substrate 10 is mounted on the Z direction moving stage 31. Moreover, the Z direction moving stage 31 can be moved by the moving mechanism 40 which will be described later, between a dropping position which is directly beneath the printing head 20, and a transfer position which is directly beneath a transfer position on the printing medium 5 which is held in parallel to the pattern forming surface 15a by the holding mechanism which is not shown in the diagram. The transfer mechanism 30 moves the Z direction moving stage 31 at the transfer position and brings the electroconductive liquid 3 on the pattern forming surface 15a in contact with the printing medium 5.

The moving mechanism 40 includes an X direction moving stage 41 which is movable in an X direction parallel to a horizontal plane (surface) by a motor 41a (refer to FIG. 4), and a Y direction moving stage 43 which is movable in a Y direction which is parallel to the horizontal plane (surface), and orthogonal to the X direction, by a motor 43a (refer to FIG. 4). Here, as shown in FIG. 1, the Y direction moving stage 43 is mounted on the X direction moving stage 41, and the Z direction moving stage 31 is mounted on the Y direction moving stage 43. Consequently, the moving mechanism 40 is capable of moving the Z direction moving stage 31 on which the pattern forming substrate 10 is mounted, in the horizontal plane (surface).

Here, the controller 60 will be described below. The controller 60 includes a general purpose personal computer for example. The computer accommodates the hardware such as a central processing unit (CPU), a read only memory (ROM), a random access memory (RAM), and a hard disc, and in the hard disc, various software which includes computer programs for controlling an operation of the entire pattern forming apparatus 1 is stored. Moreover, by combining the hardware and the software, an overall-pattern storage section 61, a partial-pattern storage section 62, a liquid-amount determining section 63, an electric potential controller 64, a transfer controller 65, and a positioning section 66 (refer to FIG. 4) are built.

Next, the controller 60 will be described below while referring to FIG. 4, which is a block diagram showing a schematic structure of the controller 60. As shown in FIG. 4, the controller 60 includes the overall-pattern storage section 61, the partial-pattern storage section 62, the liquid-amount determining section 63, the electric potential controller 64, the transfer controller 65, and the positioning section 66. Moreover, the printing head 20, the driver IC 14, the motor 31a of the transfer mechanism 30, and the motors 41a and 43a of the moving mechanism 40 are connected to the controller 60.

The overall-pattern storage section 61 stores a pattern which is to be formed on one printing medium 5. The partial-pattern storage section 62 stores a pattern (called as a 'formation pattern' in the following description) which is a part of the pattern stored in the overall-pattern storage section 61, and which is (to be) formed on the printing medium 5 by a transfer carried out once. A storage content of the partial-pattern storage section 62 is updated at each transfer carried out.

The liquid-amount determining section 63 determines an amount of the electroconductive liquid 3 which is required for making the formation pattern, based on the formation pattern stored in the partial-pattern storage section 62, as an amount of the electroconductive liquid 3 to be dropped on the pattern forming surface 15a, and outputs to the printing head 20.

The electric potential controller 64 controls the electric potential of each of the electrodes 13 by outputting a control signal to the driver IC 14. More particularly, the electric potential controller 64 controls such that, when the electroconductive liquid 3 on the pattern forming surface 15a is to be formed as a certain pattern, the number of the electrodes 13 to which the positive electric potential is applied is let to be directly correlated with the amount of the electroconductive liquid 3 dropped on the pattern forming surface 15a, or in other words, the amount of the electroconductive liquid 3 which is determined by the liquid amount determining section 63. At the same time, the electric potential controller 64 controls such that the number of electrodes 13 to which the ground electric potential is applied is let to be inversely correlated with the amount of the electroconductive liquid 3 which is determined by the liquid amount determining section 63.

Concretely, before dropping the electroconductive liquid 3 on the pattern forming surface 15a, the electric potential controller 64 outputs to the driver IC 14 a control signal which applies the positive electric potential to the electrodes 13 which form a group at a central portion of the plurality of electrodes 13 arranged in a matrix form, and applies the ground electric potential to the other electrodes 13. Accordingly, the liquid repellent property of the area on the pattern forming surface 15a, facing the electrodes 13 to which the positive electric potential is applied is lowered. Therefore, the electroconductive liquid 3 dropped on the pattern forming surface 15a is spread at a central portion of the pattern forming surface 15a (area of the pattern forming surface 15a facing the electrodes 13 to which the positive electric potential is applied), wetting the central portion. At this time, a pattern of the electroconductive liquid 3 existing to be dried up at a central portion of the pattern forming surface 15a is called as an 'initial pattern'. In the first embodiment, the number of electrodes 13 to which the positive electric potential is applied at this time is same as the number of electrodes 13 on the pattern forming surface 15a, facing an area corresponding to the formation pattern recorded in the partial-pattern storage section 62.

Moreover, the electric potential control section 64 outputs a control signal to the driver IC 14 for bringing the shape of the electroconductive liquid 3 arranged on the pattern forming surface 15a to be close to the formation pattern, based on the formation pattern stored in the partial-pattern storage section 62, the control signal being used for applying the positive electric potential to the electrodes 13 facing the area of the pattern forming surface 15a, corresponding to the formation pattern, and also being used for applying the ground electric potential to the electrodes 13 facing the area away from the formation pattern.

Furthermore, when the formation pattern stored in the partial-pattern storage section 62 has a plurality of mutually isolated portions, the electric potential controller 64 is capable of making the shape of the electroconductive liquid 3 to be the intermediate pattern which is a shape between (intermediate of) the initial pattern and the formation pattern, before applying the positive electric potential to the electrodes 13 facing the area corresponding to the formation pattern. In this case, the electric potential control section 64 outputs to the driver IC 14, a control signal for applying the positive electric potential to the electrodes 13 facing the area corresponding to the intermediate pattern on the pattern forming surface, and the ground electric potential to the electrodes 13 facing the area away from the intermediate pattern. At this time, in the first embodiment, the number of electrodes 13 to which the positive electric potential is applied is same as the number of electrodes 13 facing the area corresponding to the formation pattern in the pattern forming surface 15a.

The electric potential control section 64 outputs to the driver IC 14 a control signal for applying the ground electric potential to all the electrodes 13, after the electroconductive liquid 3 on the pattern forming surface 15a is brought into contact with the printing medium 5 by the transfer mechanism 30.

The transfer controller 64 outputs a control signal to the motor 31a of the transfer mechanism 30, and moves the pattern forming substrate 10 upward, and brings the electroconductive liquid 3 on the pattern forming surface 15a, and the printing medium 5 into contact, after applying the positive electric potential to the electrodes 13 facing the area of the pattern forming area 15a, corresponding to the formation pattern stored in the partial-pattern storage section 62.

The positioning section 66 outputs a control signal to the motor 41a of the X direction moving stage 41 and the motor 43a of the Y direction moving stage 43, and moves the position of the pattern forming substrate 10 in a horizontal plane (surface) which is parallel to the pattern forming surface 15a. Concretely, at the time of dropping the electroconductive liquid 3 on the pattern forming surface 15a, the pattern forming substrate 10 is moved to a dropping position which is directly beneath the printing head 20. Further, after the electroconductive liquid 3 is dropped on the pattern forming surface 15a, the pattern forming substrate 10 is moved to a position directly beneath the printing medium 5 which is supported at a right side of the printing head 20 in FIG. 1. More particularly, the pattern forming substrate 10 is moved to a position (transfer position) on the printing medium 5, which is directly beneath a location of transferring the formation pattern formed on the pattern forming surface 15a.

Figure 5:
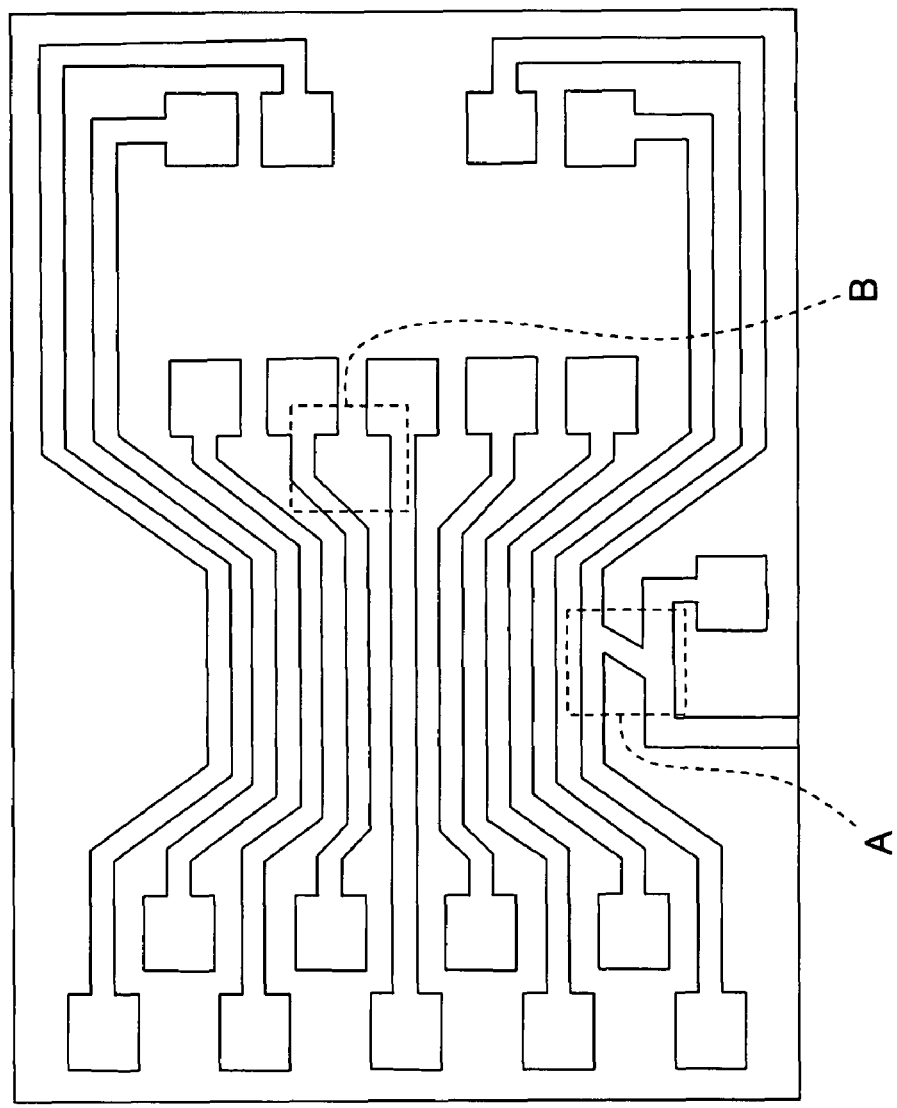
FIG. 5 is an example of a pattern formed by using the pattern forming apparatus shown in FIG. 1.
Figure 6A:
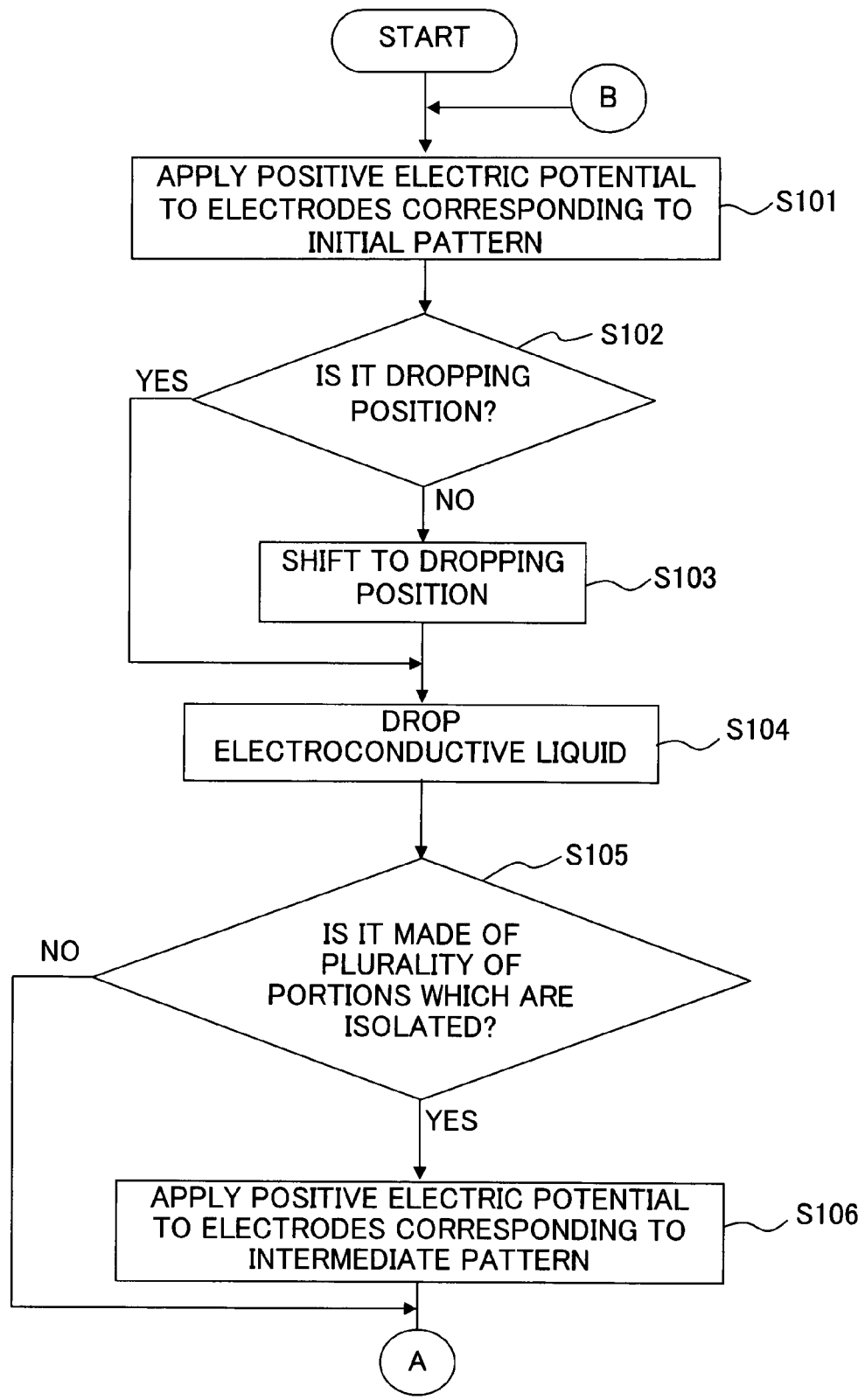
FIG. 6A and FIG. 6B are flowcharts showing a processing procedure in the pattern forming apparatus shown in FIG. 1.
Figure 6B:
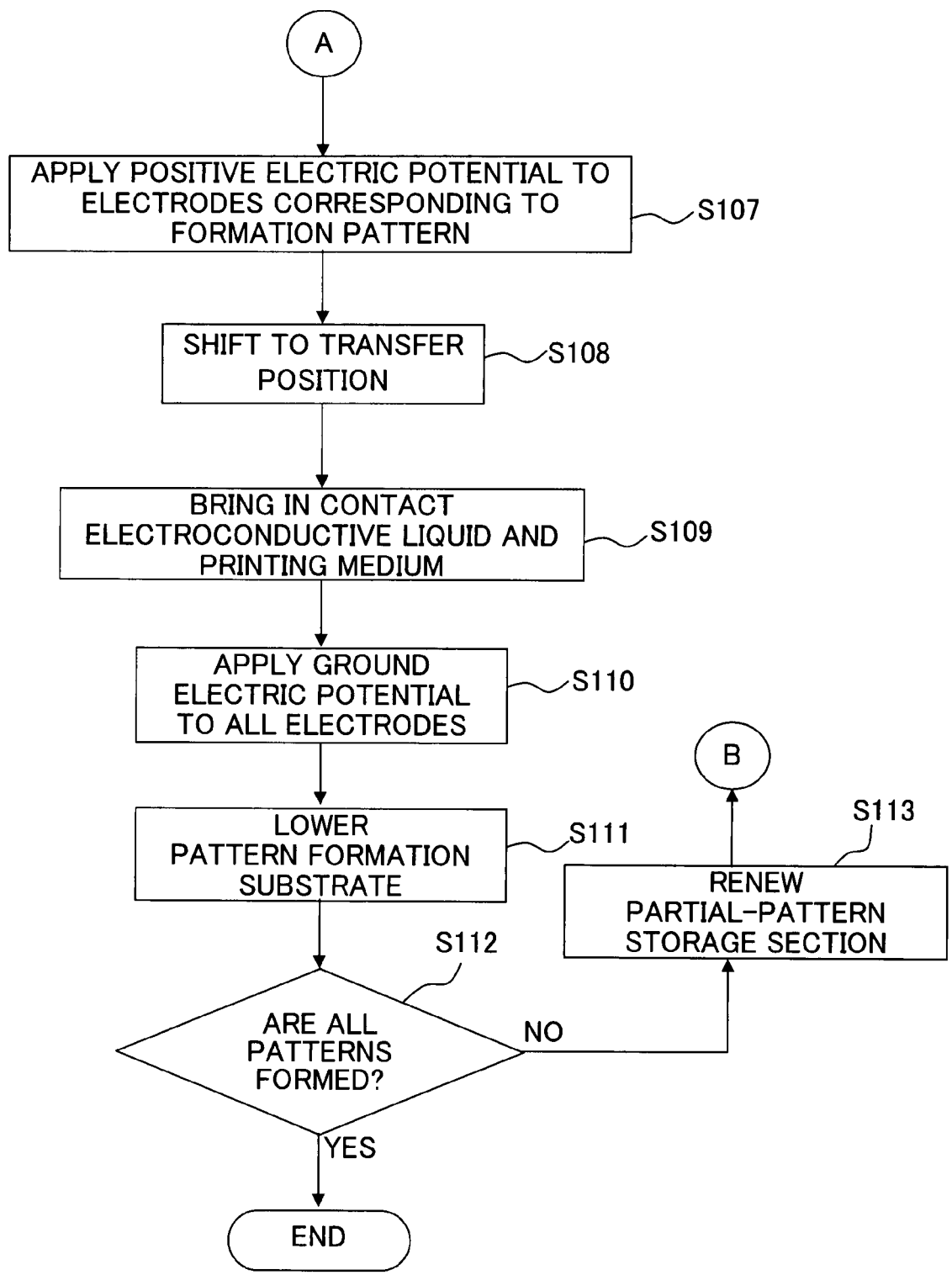

Next, a procedure for preparing an FPC by forming a wiring pattern as shown in FIG. 5 on the printing medium 5 made of a polyimide film, by using the electroconductive liquid 3 will be described below with reference to FIGS. 6A and 6B which are flowcharts showing a processing procedure in the pattern forming apparatus 1 of the first embodiment.

It is assumed that a pattern as shown in FIG. 5 is let to be stored in the overall-pattern storage section 61. Moreover, patterns in an area A and an area B shown by dashed lines in FIG. 5 for example, are stored as formation patterns, in the partial-pattern storage section 62, and based on the formation pattern, the amount of the electroconductive liquid 3 is determined in the liquid amount determining section 63.

Figure 7:
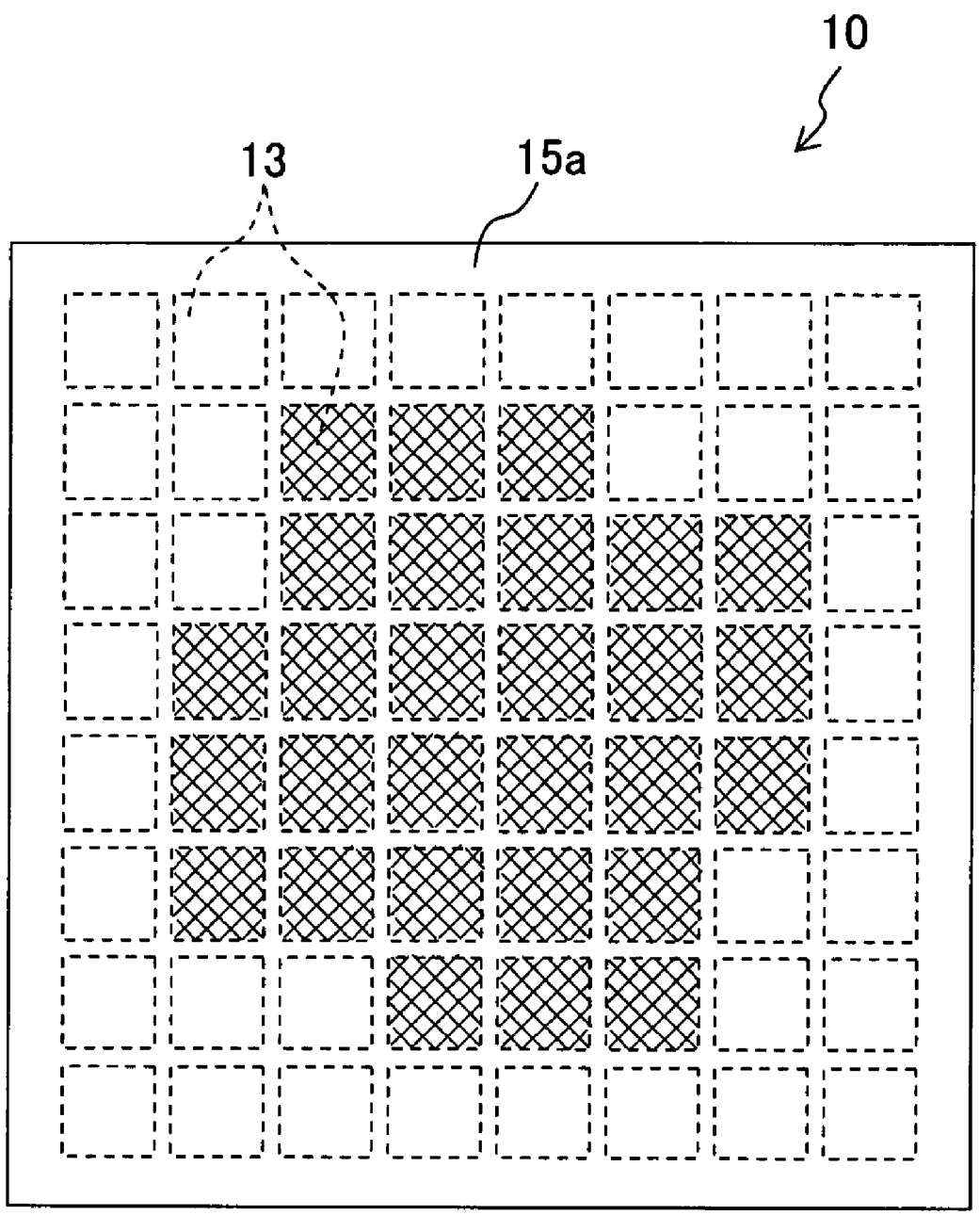
FIG. 7 is a diagram showing a state in which an electric potential of electrodes corresponding to an initial pattern is let to be a positive electric potential, in the pattern forming apparatus shown in FIG. 1.

Firstly, by the control of the electric potential control section 64, the driver IC 14, as shown in FIG. 7, supplies to each electrode 13 an electric potential signal for applying (which applies) the positive electric potential to the electrodes 13 (electrodes 13 shown by inclined grills in FIG. 7) corresponding to the initial pattern which is determined according to the amount of the electroconductive liquid 3 determined by the liquid amount determining section 63, and the ground electric potential to the electrodes 13 away from the initial pattern (step S101). Next, a judgment of whether or not the pattern forming substrate 10 is directly beneath the dropping position (dripping position) is made (step S101). Here, when the pattern forming substrate 10 is judged to be directly beneath the dropping position, (YES at step S102), step S103 which will be described later is omitted, and the process advances to step S104. On the other hand, when the pattern forming substrate 10 is judged not to be directly beneath the dropping position, (NO at step S102), by the control of the positioning section 66, the moving mechanism 40 moves the pattern forming substrate 10 to the dropping position (step S101).

Figure 8:
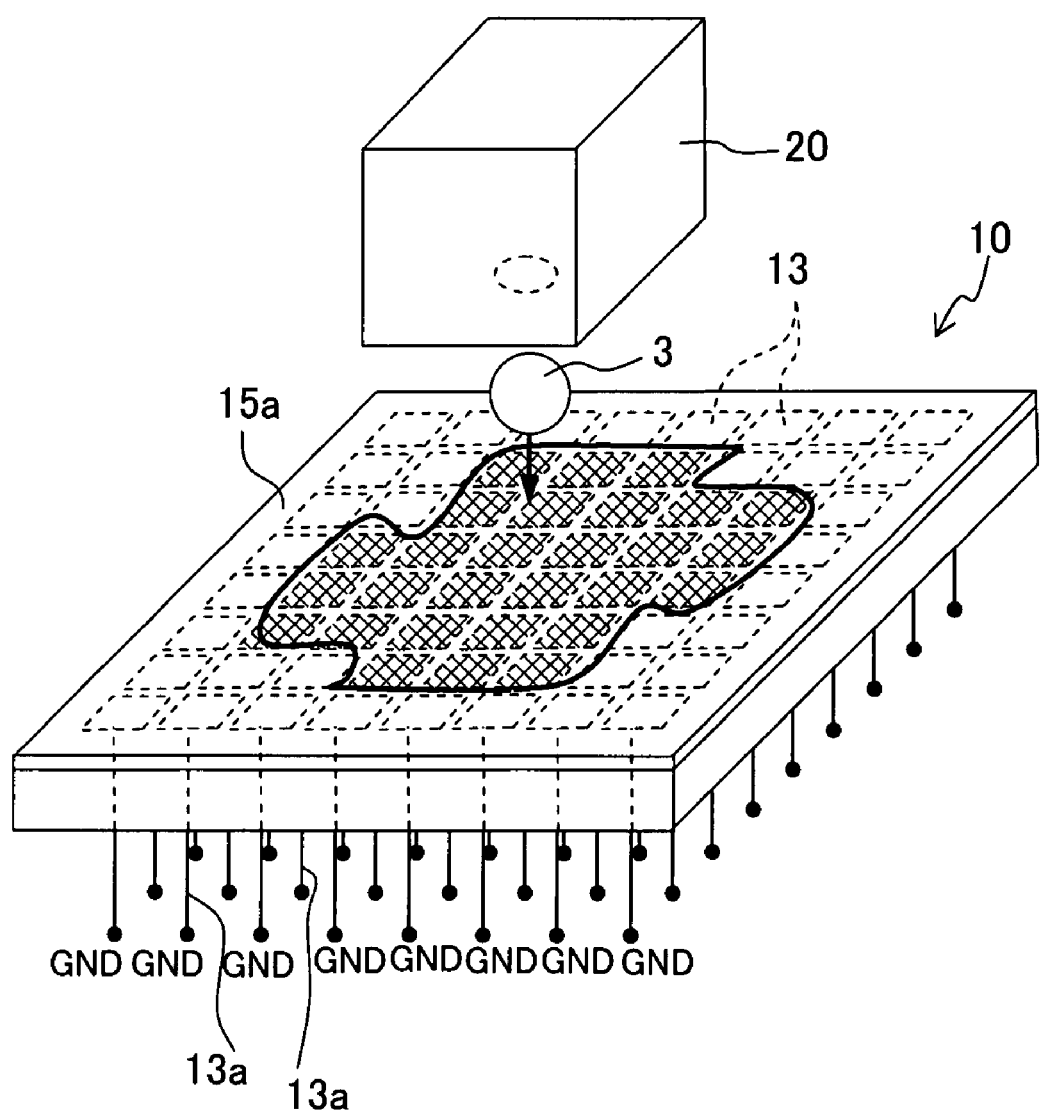
FIG. 8 is a diagram indicating a liquid arranging step (process) in the pattern forming apparatus shown in FIG. 1.

Next, the printing head 20 drops on the pattern forming surface 15a, the electroconductive liquid 3 of the amount determined by the liquid amount determining section 63 (step S104). The abovementioned steps S1 to S4 correspond to electroconductive liquid arranging step (process) (arranging (placing) electroconductive liquid). At this time, as shown in FIG. 8, the shape of the electroconductive liquid 3 dropped on the pattern forming surface 15a becomes same as (the shape of) the initial pattern. Thereafter, a judgment of whether or not the formation pattern stored in the partial-pattern storage section 62 has a plurality of mutually isolated portions is made (step S105). Here, when the pattern corresponding to the area A surrounded by the dashed lines in FIG. 5 is stored in the partial-pattern storage section 62, in other words, when the formation pattern does not have (does not includes) mutually isolated portions, (NO at step S105), step S106 which will be described later, is omitted.

Figure 9A:
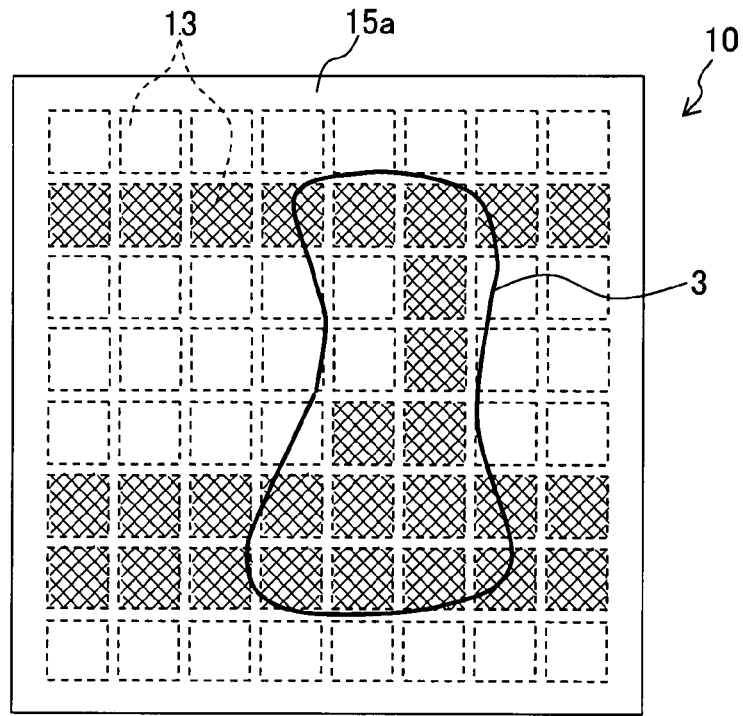
FIG. 9A and FIG. 9B are diagrams in which, an electroconductive liquid having an initial pattern shown in FIG. 8, is let to be a formation pattern (pattern formed)
Figure 9B:
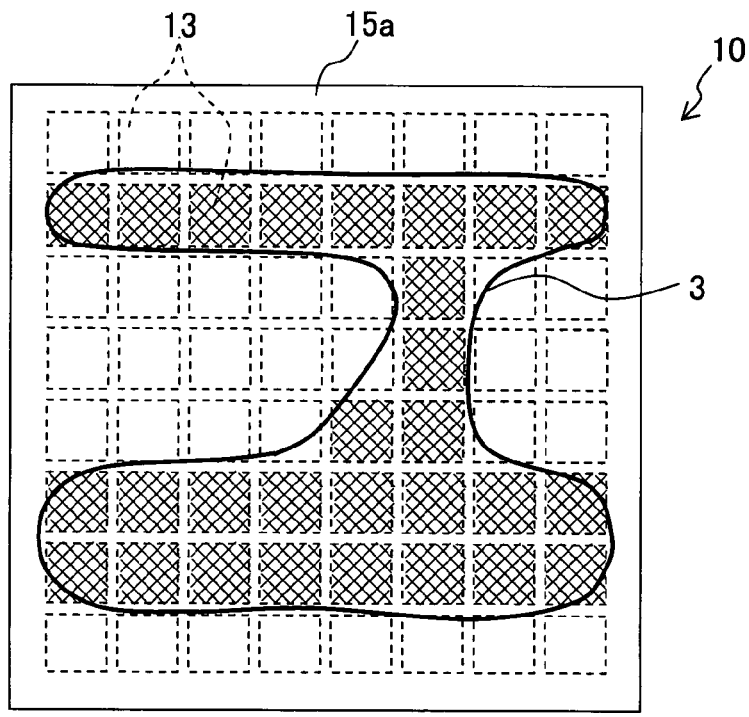

Next, by the control of the electric potential control section 64, the driver IC 14, as shown in FIG. 9, supplies an electric potential signal to each electrode 13 for applying (which applies) the positive electric potential to the electrodes 13 (electrodes 13 shown by inclined grills in FIG. 9A and FIG. 9B) corresponding to the formation pattern stored in the partial-pattern storage section 62, and the ground electric potential to the electrodes 13 away from the formation pattern (which are not in the formation pattern) (step S107). At this time, a liquid repellent property of an area on the pattern forming surface 15a, facing the electrodes 13 to which the positive electric potential is applied, is degraded (lowered) as compared to a liquid repellent property of the other area. Consequently, after the positive electric potential is applied to the electrodes 13 corresponding to the formation pattern in step S107, the electroconductive liquid 3 on the pattern forming surface 15a tends to be spread on the area corresponding to the formation pattern, wetting this area (refer to FIG. 9A). Further, after the positive electric potential is applied to the electrodes 13 corresponding to the formation pattern, when the sufficient time (for example few tens of milliseconds) is elapsed, the electroconductive liquid 3 tends to be spread on the area corresponding to the formation pattern, wetting this area (refer to FIG. 9B).

Figure 10:
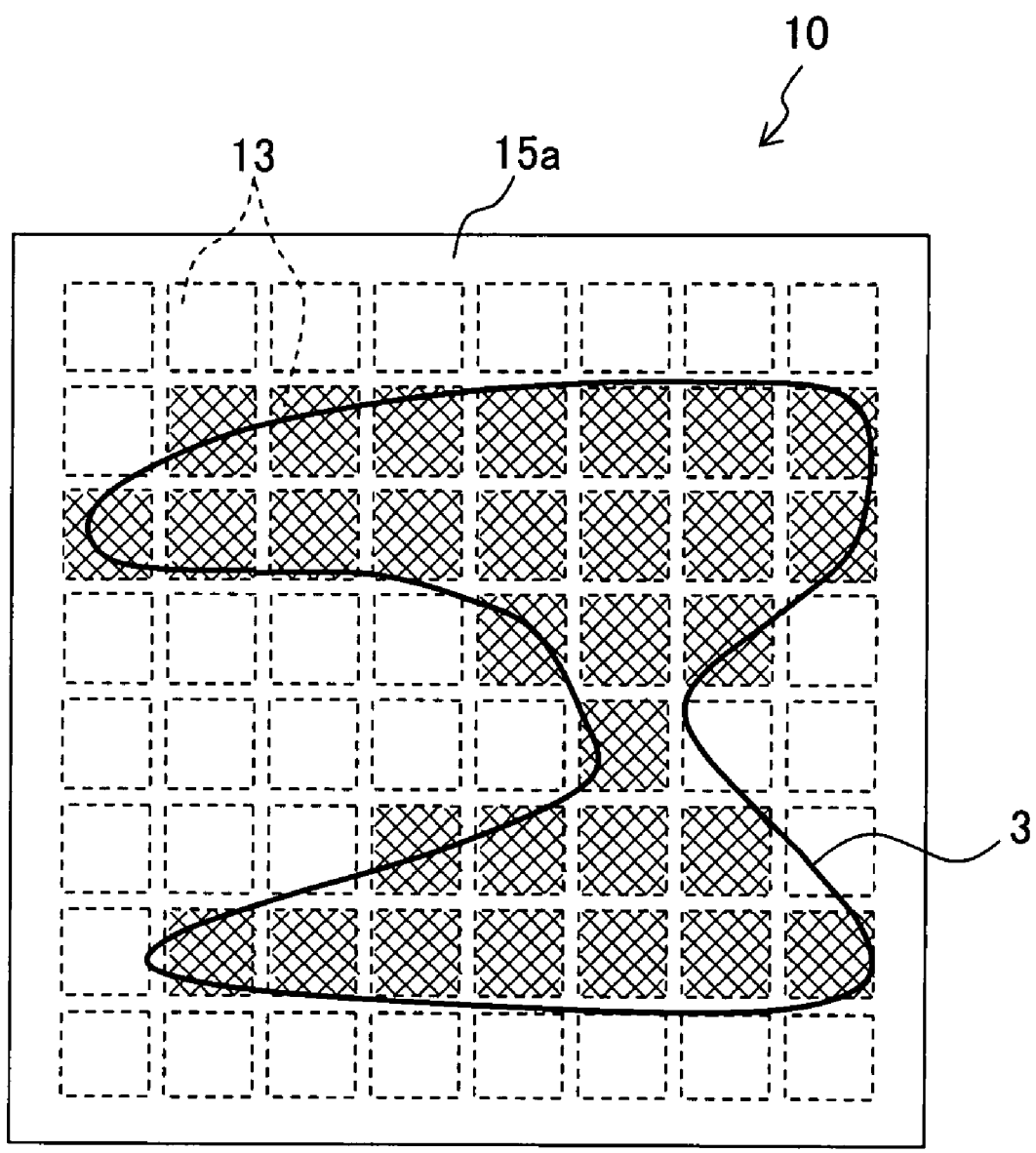
FIG. 10 is a diagram showing a state in which the electroconductive liquid which is arranged in the step (process) shown in FIG. 8, is let to be an intermediate pattern.

On the other hand, when the pattern corresponding to the area B surrounded by the dashed lines in FIG. 5 is stored in the partial-pattern storage section 62, in other words, when the formation pattern has (includes) a plurality of mutually isolated portions (YES at step S105), by the control of the electric potential control section 64, the driver IC 14, as shown in FIG. 10, supplies an electric potential signal to each electrode 13 for applying (which applies) the positive electric potential to the electrodes 13 (electrodes 13 shown by inclined grills in FIG. 10) corresponding to the intermediate pattern which has a shape between (intermediate of) the initial pattern and the formation pattern, and the ground electric potential to the electrodes 13 away from the intermediate pattern (electrodes 13 which are not in the intermediate pattern) (step S106). At this time, since a liquid repellent property of an area of the pattern forming surface 15a, facing the electrodes 13 to which the positive electric potential is applied, is degraded (lowered) as compared to a liquid repellent property of the other (remaining) area, the electroconductive liquid 3 on the pattern forming surface 15a is spread in the area corresponding to the intermediate pattern, wetting this area, as shown in FIG. 10.

Figure 11A:
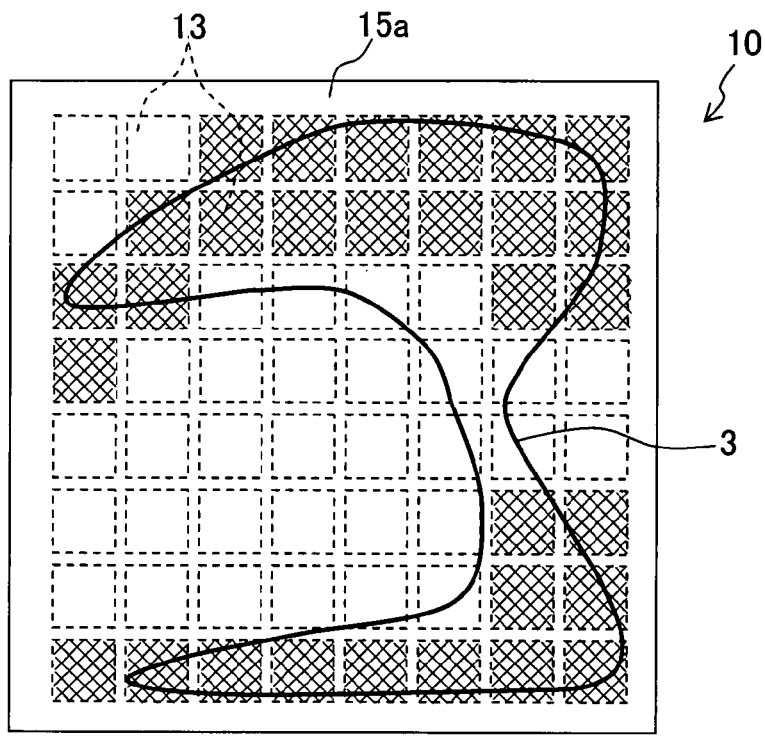
FIG. 11A and FIG. 11B are diagrams in which, an electroconductive liquid having the intermediate pattern shown in FIG. 10, is let to be a formation pattern (pattern formed)
Figure 11B:
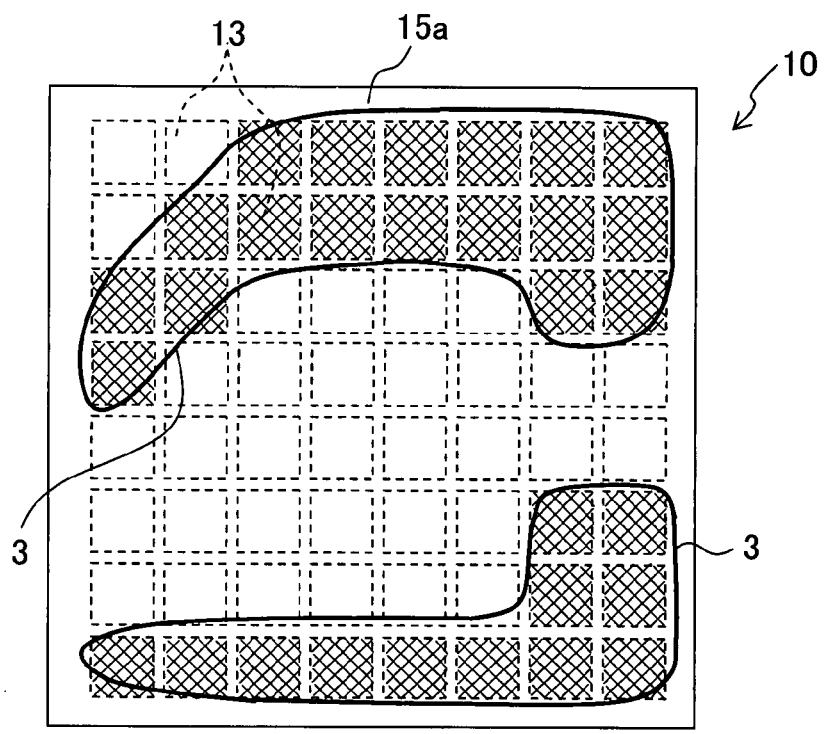

Thereafter, the process advances to step S107, and as shown in FIG. 11, the positive electric potential is applied to the electrodes 13 (electrodes 13 shown by inclined grills in FIG. 11) corresponding to the formation pattern. At this time, the electroconductive liquid 3 which is spread in the intermediate pattern form, tends to be spread on the area corresponding to the formation pattern, wetting this area (refer to FIG. 11A). Further, after the positive electric potential is applied to the electrodes 13 corresponding to the formation pattern, when the sufficient time is elapsed, the electroconductive liquid 3 tends to be spread on the area corresponding to the formation pattern, wetting this area (refer to FIG. 11B). The abovementioned steps S105 to S107 correspond to an electric potential applying step (process) (applying electric potential).

Figure 12:
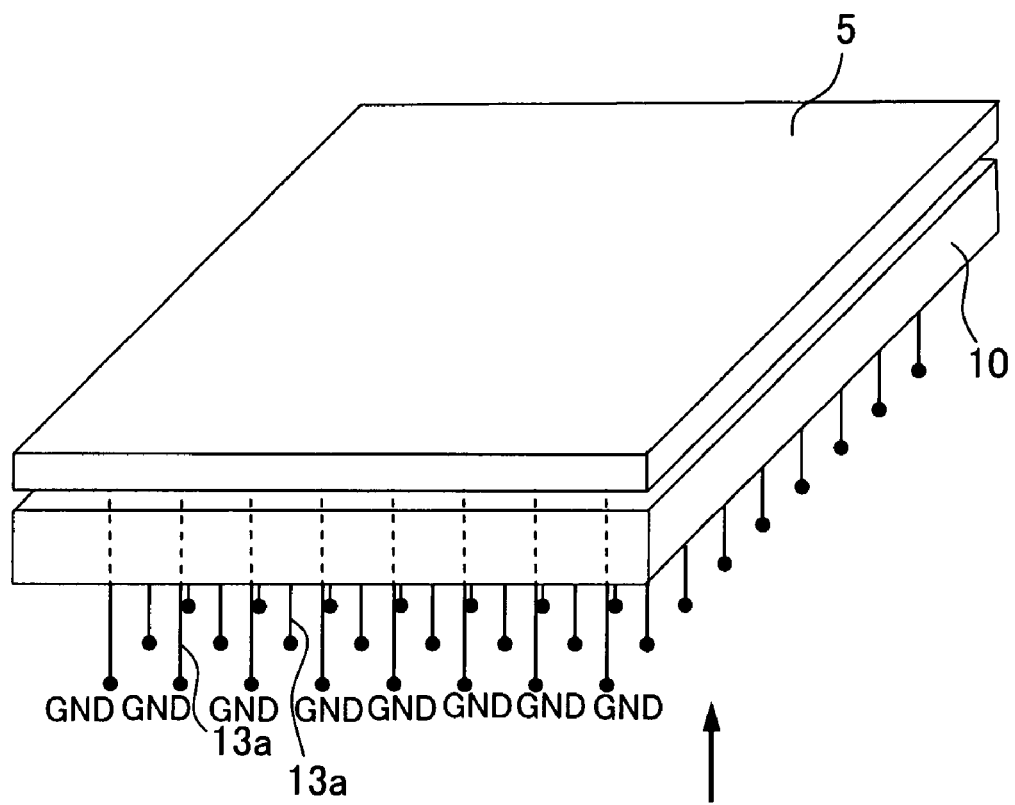
FIG. 12 is a diagram indicating a transfer step (process) in the pattern forming apparatus shown in FIG. 1.

Next, by the control of the positioning section 66, the moving mechanism 40 moves the pattern formation substrate 10 to the transfer position (step S108). Furthermore, as shown in FIG. 12, by the control of the transfer control section 65, the transfer mechanism 30 moves the pattern forming substrate 10 upward, and brings the electroconductive liquid 3 formed as the formation pattern in contact with the printing medium 5 (step S109). Next, by the control of the electric potential control section 64, the driver IC 14, supplies an electric potential signal for applying (which applies) the positive electric potential 13 to all the electrodes 13 (step S110). At this time, a liquid repellent property of an area of the pattern forming surface 15a, facing the electrodes 13 corresponding to the formation pattern becomes superior as compared to a case in which the positive electric potential is applied to the electrodes 13 in this area, and a liquid repellent property of the pattern forming surface 15a becomes uniform. Moreover, as it has been described above, since the liquid repellent property of the pattern forming surface 15a when the ground electric potential is applied to the electrodes 13, is superior to a liquid repellent property of the printing medium 5, the electroconductive liquid 3 on the pattern forming surface 15a is transferred assuredly to the printing medium 5.

Next, by the control of the transfer control section 65, the transfer mechanism 30 lowers (makes descend) the pattern forming substrate 10 (step S111). The abovementioned steps S108 to S111 correspond to a transfer step (process). Furthermore, a judgment of whether or not an entire pattern stored in the overall-pattern storage section 61 is formed on the printing medium 5 is made (step S112). Here, when a judgment is made that the pattern stored in the overall-pattern storage section 61 has not been formed yet (NO at step S112), the formation pattern stored in the partial-pattern storage section 62 is rewritten (renewed) to a pattern corresponding to a portion which is not yet formed, out of the pattern stored in the overall-pattern storage section 61 (step S113). Thereafter, coming back to step S101, the electric potential of the electrodes 13 corresponding to the initial pattern which is determined based on the formation pattern rewritten in step S113 is let to be the positive electric potential. On the other hand, in step S112, when a judgment is made that the entire pattern stored in the overall-pattern storage section 61 has been formed (YES at step S112), the processing in the pattern forming apparatus 1 is terminated.

As it has been described above, the pattern forming substrate 10 of the first embodiment includes the substrate 11 which is non-electroconductive, the plurality of electrodes 13 arranged in a matrix form on the substrate 11, to be mutually isolated, and the insulating layer 15 which covers the electrodes 13. Moreover, in the pattern forming apparatus 1 and the pattern forming method of the first embodiment, the electric potential control section 64 controls the driver IC 14 which selectively applies the ground electric potential and the positive electric potential to the electrodes 13 of the pattern forming substrate 10. Concretely, the electric potential control section 64, outputs to the driver IC 14 the control signal for applying the positive electric potential to the electrodes 13 corresponding to the formation pattern, with the electroconductive liquid 3 arranged (placed) on the pattern forming surface 15a of the pattern forming substrate 10, and the ground electric potential to the electrodes 13 away from the formation pattern. Moreover, the transfer mechanism 30 transfers the electroconductive liquid 3 spread in a shape same as the (shape of the) formation pattern on the pattern forming surface 15a by bringing the electroconductive liquid 3 in contact with the printing medium 5. Consequently, by arranging the fine electrodes 13, it is possible to form a fine two-dimensional pattern of the electroconductive liquid 3 on the pattern forming surface 15a, and by transferring this pattern to the printing medium 5, it is possible to form a fine pattern on the printing medium 5. Moreover, since it is possible to form the pattern on the printing medium 5 only by the step (process) of arranging the electroconductive liquid 3 on the pattern forming substrate 10, the step (process) of applying the electric potential to the electrodes 13, and the step (process) of transferring the pattern formed to the printing medium 5, the cost of processing is low.

Moreover, in the pattern forming apparatus 1 and the pattern forming method of the first embodiment, when the ground electric potential is applied to the electrodes 13, the liquid repellent property of the area of the pattern forming surface 15a, facing the electrodes 13 is superior to the liquid repellent property of the printing medium 5. After the electroconductive liquid 3 on the pattern forming surface 15a makes a contact with the printing medium 5, since the ground electric potential is applied to all the electrodes 13 by the control of the electric potential control section 64. Consequently, the electroconductive liquid 3 is transferred assuredly to the printing medium 5.

Furthermore, in the pattern forming apparatus 1 and the pattern forming method of the first embodiment, when the formation pattern has the plurality of mutually isolated portions, by the control of the electric potential control section 64, the positive electric potential is applied to the electrodes 13 corresponding to the intermediate pattern and the ground electric potential is applied to the electrodes away from the intermediate pattern, before the positive electric potential is applied to the electrodes 13 corresponding to the formation pattern. Consequently, it is possible to shift smoothly the electroconductive liquid 3 arranged (placed) on the pattern forming surface 15a to (be) the formation pattern.

Moreover, the pattern forming apparatus 1 of the present invention includes the printing head 20 which drops the electroconductive liquid 3 on the pattern forming surface 15a. Consequently, it is possible to arrange (place) the electroconductive liquid 3 easily on the pattern forming surface 15a.

In the pattern forming apparatus 1 and the pattern forming method of the first embodiment, before the electroconductive liquid 3 is dropped on the pattern forming surface 15a, the positive electric potential is applied to the electrodes corresponding to the initial pattern, in other words, to the electrodes 13 which form a group at the central portion, from among the plurality of electrodes, and the ground electric potential is applied to the rest of the electrodes 13. Consequently, it is possible to accumulate (hold) the electroconductive liquid 3 at the central portion of the pattern forming surface 15a. Accordingly, it is possible to prevent the electroconductive liquid 3 from falling from the pattern forming surface 15a. Furthermore, it is possible to change smoothly the pattern of the electroconductive liquid 3 to the intermediate pattern or the formation pattern.

Moreover, in the pattern forming apparatus 1 and the pattern forming method of the first embodiment, the printing medium 20 drops on the pattern forming surface 15a, the amount of the electroconductive liquid 3 required for preparing the formation pattern which is stored in the partial-pattern storage section 62. Further, the electric potential control section 64 outputs the control signal to the driver IC 14 such that the number of electrodes 13 facing the area of the pattern forming surface 15a, corresponding to the formation pattern becomes same as the number of electrodes 13 corresponding to the initial pattern and the number of electrodes 13 corresponding to the intermediate pattern. Consequently, at the time of applying the positive electric potential to the electrodes 13 corresponding to the initial pattern or the intermediate pattern, it is possible to let the electroconductive liquid 3 to be spread over the entire surface of the pattern, without being run off (spread out) from the pattern.

Furthermore, in the pattern forming apparatus 1 and the pattern forming method of the first embodiment, the plurality of electrodes 13 is covered by the insulating layer 15. Here, it has been known that the electrowetting phenomenon occurs even in a case in which the plurality of electrodes 13 is not covered by the insulating layer 15, and with the electroconductive liquid 3 kept at the ground electric potential is dropped on the pattern forming surface 15a (in other words, a surface of the substrate 11 on side on which the plurality of electrodes 13 is arranged) of the pattern forming substrate 10, the electric potential of the electrodes 13 is let to be the positive electric potential. The liquid repellent property of the area of the pattern forming surface 15a, facing the electrodes 13 becomes inferior as compared to the liquid repellent property of the area having no electric potential difference, between the electrodes 13 and the electroconductive liquid 3. However, at this time, as compared to the case in which the insulating layer 15 is there, a degree (rate) of degradation of the liquid repellent property of the area facing the electrodes 13 let to be at the positive electric potential becomes low (small), and a robustness and a reproducibility are degraded (source: C. Quilliet, B. Berge, "Electrowetting: a recent outbreak", Current Opinion in Colloid & Interface Science 6 (2001) 34-39). Consequently, in the first embodiment, since it is possible to lower (degrade) substantially the liquid repellent property of the area of the pattern forming surface 15a, facing the electrodes 13 to which the positive electric potential is applied, it is possible to improve a response at the time of letting the electroconductive liquid 3 placed on the pattern forming surface 15a to be the initial pattern or the intermediate pattern or the formation pattern, by the control of the electric potential control section 64.

In the pattern forming method of the first embodiment, each of the step of arranging (placing) the electroconductive liquid 3 on the pattern forming surface 15a, the step of applying the positive electric potential to the electrodes 13 corresponding to the formation pattern, and the step of transferring the electroconductive liquid 3 formed as the formation pattern, to the printing medium 5 is carried out for a plurality of times in the abovementioned order. Consequently, it is possible to prepare the entire pattern as shown in FIG. 5.

Moreover, in the pattern forming substrate 10 of the first embodiment, the electrodes 13 are flat plates having a square shape in a plan view, and are arranged on one plane. Consequently, it is possible to manufacture easily as compared to a case in which the electrodes 13 are arranged on an irregular surface.

Figure 13A:
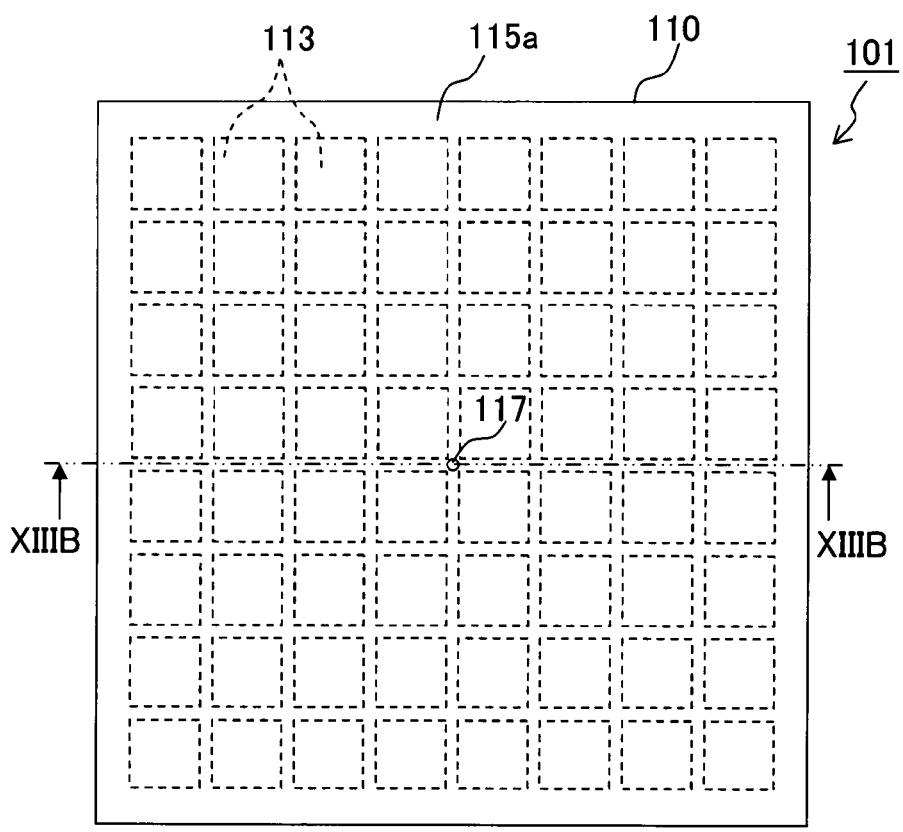
FIG. 13A is a diagram showing a pattern forming substrate provided in a pattern forming apparatus according to a second embodiment of the present invention.
Figure 13B:
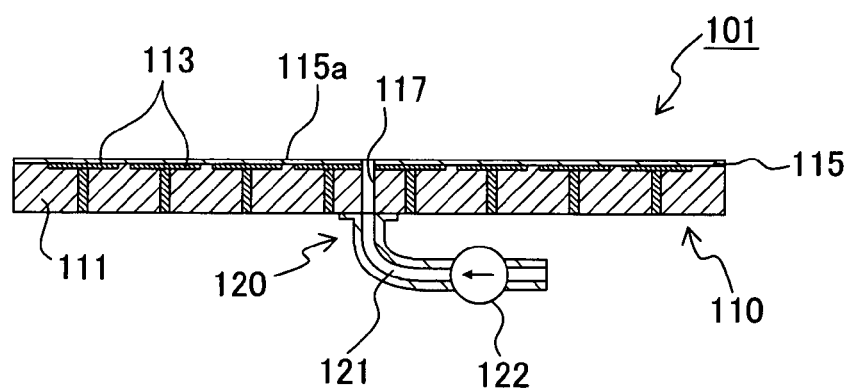
FIG. 13B is a liquid sending mechanism (liquid supplying mechanism) provided in the pattern forming apparatus according to the second embodiment of the present invention.

Next, a second embodiment of the present invention will be described below while referring to FIG. 13A and FIG. 13B. FIG. 13A is a top view of a pattern forming substrate 110 included in a pattern forming apparatus 101 of the second embodiment, and FIG. 13B is a cross-sectional view along a line XIIIB-XIIIB in FIG. 13A. The main point of difference between a structure of the pattern forming apparatus 101 according to the second embodiment, and the structure of the pattern forming apparatus 1 according to the first embodiment is as follows. In the pattern forming apparatus 1 of the first embodiment, the electroconductive liquid 3 arranged (placed) on the pattern forming surface 15a is dropped from the printing head 20, whereas in the pattern forming apparatus 101 of the second embodiment, the electroconductive liquid 3 arranged (placed) on a pattern forming surface 115a is supplied to the pattern forming surface 115a via a supply hole 117 having one opening on (in) the pattern forming surface 115a. The rest of the structure is almost similar as in the first embodiment. Same reference numerals are assigned to components which have almost similar structure as in the first embodiment, and the description of such components is omitted.

As shown in FIG. 13A and FIG. 13B, the supply hole 117 which is cut through the pattern forming substrate 110 (more concretely, cut through a substrate 111 and an insulating layer 115) is formed in a central portion in the pattern forming substrate 110 of a plate member having a square shape in a plan view. In other words, the supply hole 117 cut through the substrate 111 and the insulating layer 115 opens (has openings) on the pattern forming surface 115a of the insulating layer 115, and on a surface (hereinafter, called as a 'rear surface') of the substrate 111, on an opposite side of a side on which electrodes 113 are arranged.

Furthermore, as shown in FIG. 13B, the pattern forming apparatus 101 includes a liquid sending mechanism (liquid supplying mechanism) 120 which supplies the electroconductive liquid 3 to (on) the pattern forming surface 115a via the supply hole 117. The liquid sending mechanism 120 communicates with an ink tank, and includes a liquid channel 121 which is connected to the other end of the supply hole 117 on the rear surface of the substrate 111, and a pump 122 which sends the liquid inside the liquid channel 121 to the pattern forming substrate 110. Moreover, in the second embodiment, the electroconductive liquid 3 of an amount which is determined by the liquid amount determining section 63 is output to the pump 122.

As it has been described above, in the pattern forming apparatus 101 of the second embodiment, it is possible to form a fine pattern at a low cost, similarly as in the pattern forming apparatus 1 of the first embodiment.

Moreover, in the pattern forming apparatus 101 of the second embodiment, the electroconductive liquid 3 is supplied to (on) the pattern forming surface 115a via the supply hole 117 provided in the pattern forming substrate 110. Consequently, the moving mechanism 40 moves the pattern forming substrate 110 directly beneath the printing medium 5. In other words, since it is not necessary to move the pattern forming substrate 110 up to a position away from (a position) directly beneath the printing medium 5, it is possible to reduce (make small) a size of the apparatus.

Figure 14A:
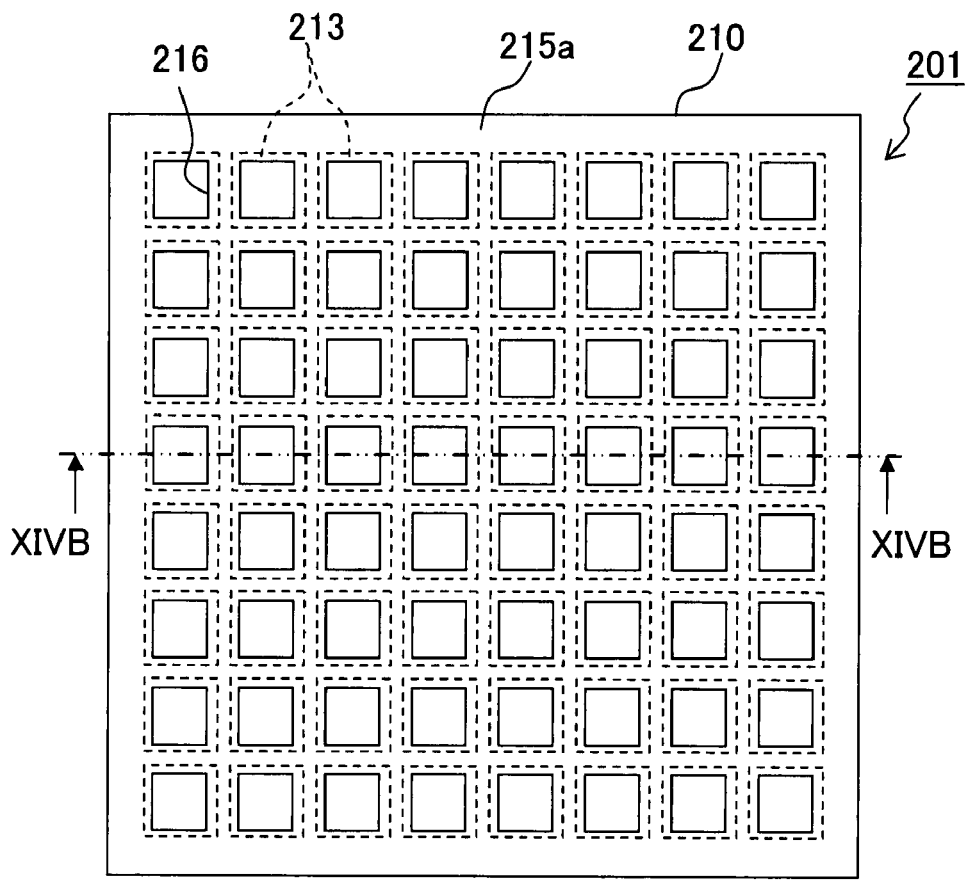
FIG. 14A is a diagram showing a pattern forming substrate provided in a pattern forming apparatus according to a third embodiment of the present invention.
Figure 14B:
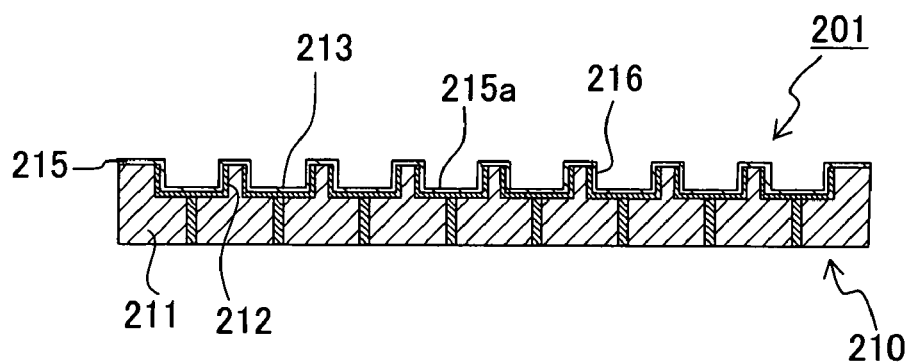
FIG. 14B is a cross-sectional view taken along a line XIVB-XIVB in FIG. 14A.

Next, a third embodiment of the present invention will be described below while referring to FIG. 14A and FIG. 14B. FIG. 14A is a top view of a pattern forming substrate 210 provided in a pattern forming apparatus 201 of the third embodiment, and FIG. 14B is a cross-sectional view along a line XIVB-XIVB in FIG. 14A. The main point of difference between a structure of the pattern forming apparatus 201 according to the third embodiment and the structure of the pattern forming apparatus 1 according to the first embodiment is as follows. In the pattern forming apparatus 1 of the first embodiment, the electrodes 13 are flat plates having a square shape in a plan view, and are arranged mutually on the same plane (surface), whereas in the pattern forming apparatus 201 of the third embodiment, a plurality of recesses 212 is formed in a substrate 211, and an electrode 213 has a shape of a recess along the recess 212. The rest of the structure is almost similar as in the first embodiment. Same reference numerals are assigned to components having a structure almost similar as in the first embodiment, and the description of such components is omitted.

As shown in FIG. 14A and FIG. 14B, the recesses 212 having a square-shaped bottom surface are formed in the form of a matrix in the substrate 211. The electrode 213 having the shape of the recess is arranged along each recess 212, and an insulating layer 215 covers the plurality of electrodes 213. In other words, an area of a pattern forming surface 215, facing the electrodes 213 becomes an inner portion of dents 216 which are formed in plurality on the pattern forming surface 215a.

As it has been described above, in the pattern forming apparatus 201 of the third embodiment, it is possible to form a fine pattern at a low cost, similarly as in the pattern forming apparatus 1 of the first embodiment.

Moreover, in the pattern forming apparatus 201 of the present invention, when the positive electric potential is applied to the electrodes 213 facing the formation pattern by the electric potential control section 64, the electroconductive liquid 3 which is placed on the pattern forming surface 215a is spread in the dents 216 facing the electrodes 213 to which the positive electric potential is applied, wetting the surface. Since the electroconductive liquid 3 which is spread in the dent 216 is stable without being run off (spread out) from the area facing the electrodes 213 to which the positive electric potential is applied, a capability of forming the liquid pattern is improved.

The exemplary embodiments of the present invention have been described above. However, the present invention is not restricted to the embodiments described above, and it is possible to carry out various design modifications which fairly fall within the basic teaching herein set forth. For example, in the embodiments from the first embodiment to the third embodiment, cases in which the moving mechanism 40 moves the pattern forming substrate 10 (110 and 210) has been described. However, without restricting to such arrangement, an arrangement may be made such that it is possible to change relative positions of the printing medium 5 (and the printing head 20), and the pattern forming substrate 10 (110 and 210). Consequently, an arrangement may be made such that the printing substrate 5 (and the printing head 20) is moved.

Figure 15A:
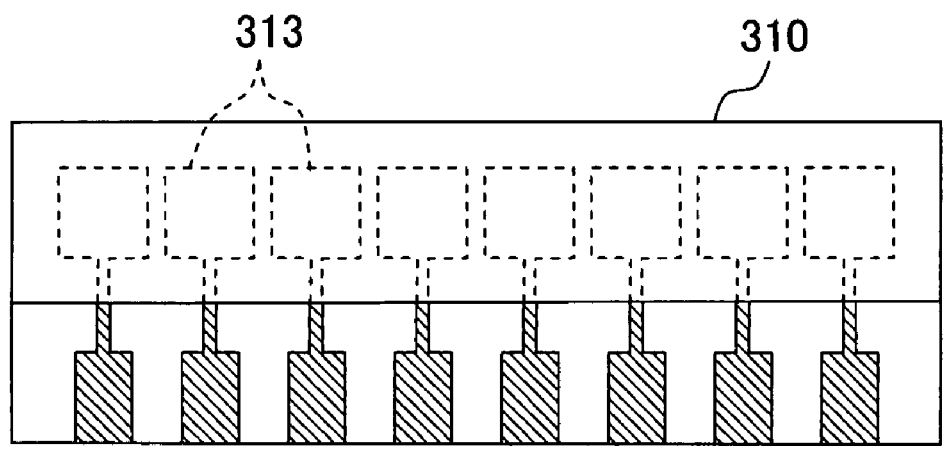
FIG. 15A and FIG. 15B are diagrams showing a modified embodiment of a pattern forming substrate according to the first embodiment of the present invention.
Figure 15B:
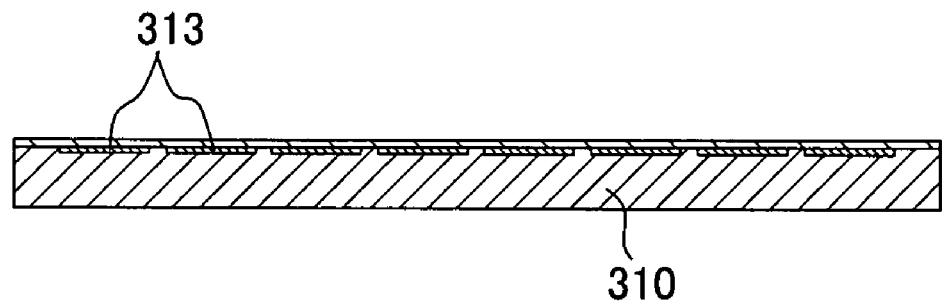

Moreover, in the embodiments from the first embodiment to the third embodiment described above, cases in which the plurality of electrodes 13 (113 and 213) is arranged in the form of a matrix on the substrate 11 (111 and 211) have been described. However, without restricting to these cases, as a modified embodiment of the pattern forming substrate 10 according to the first embodiment, a row each of patterns may be formed and transferred to the printing medium 5 by using a pattern forming substrate 310 on which a plurality of electrodes 313 is arranged along one direction as shown in FIG. 15A and FIG. 15B.

Figure 16:
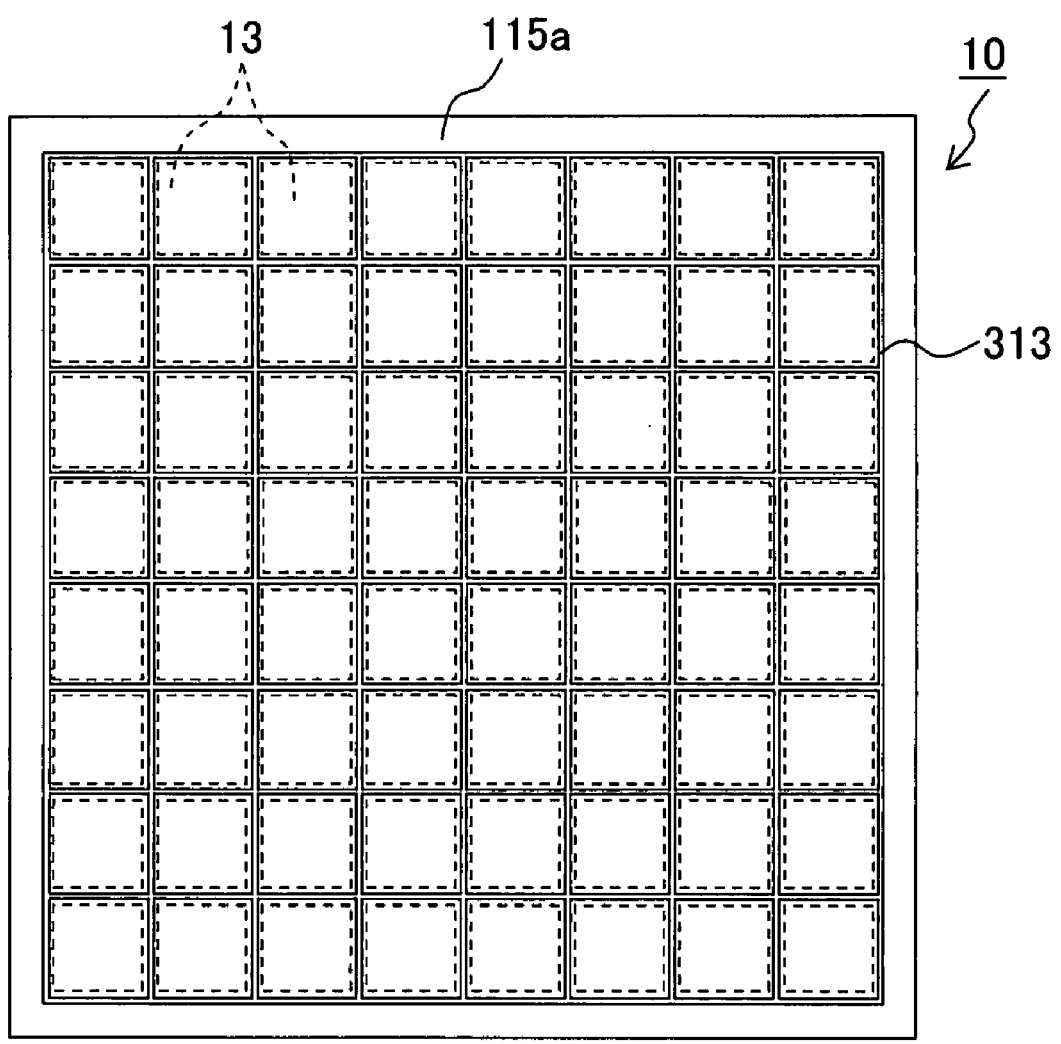
FIG. 16 is a diagram corresponding to FIG. 3A and showing the surface electrodes.

Furthermore, in the embodiments from the first embodiment to the third embodiment described above, cases in which the electroconductive liquid 3 is kept at the ground electric potential, and the driver IC 14 applies the electric potential signal to the electrodes 13 (113 and 213) to let the potential be the positive electric potential and the ground electric potential, have been described. However, the present invention is not restricted to these cases. The values of the electric potential of the electroconductive liquid 3, and the two types of electric potentials applied to the electrodes 13 (113 and 213) by the driver IC 14 may be let to be such that the area of the pattern forming surface 15a (115a and 215a) may have a predetermined liquid repellent property, and a liquid repellent property inferior to the predetermined liquid repellent property. Moreover, the two types of electric potentials which the electrodes 13 (113 and 213) may take (may be) values determined separately (uniquely) for each thereof, or may be values in a fixed range which do not overlap mutually (which are not same). As shown in FIG. 16, the surface electrodes 313 for applying the predetermined electric potential to the photoconductive liquid 3 may be formed in an area of the pattern forming surface 15a, not overlapping with the electrodes 13. In this case, it is possible to apply stably the predetermined electric potential (for example the ground electric potential) to the electroconductive liquid 3, and to improve the response at the time of forming the liquid pattern. Here, the shape of the surface electrode is not restricted to the shape shown in FIG. 16, and may be arbitrary.

Moreover, in the embodiments from the first embodiment to the third embodiment, cases in which, when the electrodes 13 (113 and 213) are at the ground electric potential, the liquid repellent property of the area of the pattern forming surface 15a (115a and 215a), facing the electrodes 13 (113 and 213) is superior to the liquid repellent property of the printing medium 5, and after the electroconductive liquid 3 on the pattern forming surface 15a (115a and 215a) makes a contact with the printing medium 5, the ground electric potential is applied to all the electrodes 13 (113 and 213) by the control of the electric potential control section 64, have been described. However, the present invention is not restricted to these cases. After the electroconductive liquid 3 and the printing medium 5 make a contact, the electric potential of the electrodes 13 (113 and 213) may be such that the liquid repellent property of the insulating layer 15 (115 and 215) is superior to the liquid repellent property of the printing medium 5. Furthermore, when an absorptivity of the liquid is high in cases such as when there are irregularities on the surface of the printing medium 5, and when the printing medium 5 is formed of a porous material, the liquid repellent property of the insulating layer 15 (115 and 215) may not be necessarily superior to (higher than) the liquid repellent property of the printing medium 5.

Furthermore, in the embodiments from the first embodiment to the third embodiment, cases in which, when the formation pattern has the plurality of mutually isolated portions, and the intermediate pattern is formed before forming the formation pattern, have been described. However, the present invention is not described to these cases. An arrangement may be made such that even when the formation pattern has (includes) the plurality of mutually isolated portions, the intermediate pattern may not be formed, and even when the formation pattern does not have the plurality of mutually isolated portions, the intermediate pattern may be formed.

In the embodiments from the first embodiment to the third embodiment, cases in which the positive electric potential is applied to the group of electrodes 13 (113 and 213) arranged on the central portion, from among the plurality of electrodes 13 (113 and 213) before placing the electroconductive liquid 3, for making the shape of the electroconductive liquid 3 placed on the pattern forming surface 15a (115a and 215a) to be same as (the shape of) the initial pattern, have been described. However, the present invention is not restricted to these cases. For example, the initial pattern may not be gathered (concentrated) at the central portion of the pattern forming surface 15a (115a and 215a), and may be scattered at a plurality of locations for example. Moreover, a timing of controlling the electric potential of the electrodes 13 (113 and 213) so that the pattern is the initial pattern, may be let to be after placing the electroconductive liquid 3. Furthermore, the initial pattern may not be prepared. In this case, before the electroconductive liquid 3 is placed (dropped), the same electric potential (for example, the ground electric potential or the positive electric potential) may be applied to all the electrodes 13 (113 and 213).

In the embodiments from the first embodiment to the third embodiment which have been described above, cases in which the number of the electrodes 13 (113 and 213) corresponding to the formation pattern, and the number of the electrodes 13 (113 and 213) corresponding to the initial pattern and the intermediate pattern respectively is the same, have been described. However, the number of electrodes 13 (113 and 213) corresponding to the initial pattern and the intermediate pattern respectively is not restricted to this, and the control may be such that the number of electrodes 13 (113 and 213) increase in direct proportion to an amount of supply of the electroconductive liquid 3 which is determined based on the formation pattern. Furthermore, the number of electrodes 13 (113 and 213) corresponding to each of the initial pattern and the intermediate pattern may be independent of the amount of supply of the electroconductive liquid 3.

Moreover, in the embodiments from the first embodiment to the third embodiment, cases in which each of the step of arranging (placing) the electroconductive liquid 3 (on the pattern forming surface 15a (115a and 215a), the step of letting the electric potential of the electrodes 13 (113 and 213) corresponding to the formation pattern to be the positive electric potential, and the step of transferring the electroconductive liquid 3 formed as the formation pattern is carried out for the plurality of times in the abovementioned order, have been described. However, the present invention is not restricted to these cases. The entire pattern may be formed by one step (at one step).

In the embodiments from the first embodiment to the third embodiment, cases in which the plurality of electrodes 13 (113 and 213) is covered by the insulating layer 15 (115 and 215) have been described. However, the insulating layer 15 (115 and 215) may not be there. In this case, as it has been described above, the degradation of the liquid repellent property of the area facing the electrodes 13 (113 and 213) to which the positive electric potential is applied is low (small). Therefore, the response at the time of letting the electroconductive liquid 3 placed on the pattern forming surface 15a (115a and 215a) to be the initial pattern, the intermediate pattern, and the formation pattern by the control of the electric potential control section 64 is degraded. However, since high response is not sought in the pattern forming apparatuses 1, 101, and 210 of the present invention, the present invention is applicable even when the insulating layer 15 (115 and 215) is not there.

In the embodiments from the first embodiment to the third embodiment, cases in which the FPC is prepared by forming a wiring pattern by the electroconductive liquid 3 on the polyimide film have been described. However, the present invention is not restricted to these cases, and is also applicable in a case of preparing an electrical wiring substrate such as a silicon substrate. Furthermore, the present invention is also applicable to preparing a fine guided wave path and a three-dimensional model, preparation of a highly-defined planar display, and formation of a fine pattern of a chemical and a biomaterial in DNA chips and µ-TAS. Here, after forming a pattern on a substrate by using an electroconductive UV curable ink, it is possible to carry out easily the three-dimensional modeling by curing (hardening) the UV curable ink by irradiating a predetermined UV light, and further by repeatedly overprinting the UV curable ink. Moreover, it is possible to form easily an optical guided wave path by forming a desired pattern by using a transparent liquid (dielectric substance) which is electroconductive and which has a predetermined refractive index. Moreover, in a case of applying the present invention to a case other than preparing an electrical wiring substrate, it is possible to use a liquid having an electroconductivity of a level which causes the electrowetting phenomenon, and not a liquid having a comparatively higher electroconductivity, in which nano electroconductive particles of a material such as copper are dispersed, such as the electroconductive liquid 3 used in the embodiments described above.

What is claimed is:

1. A pattern forming apparatus which forms a predetermined pattern of an electroconductive liquid on a printing medium, the apparatus comprising:
    a pattern forming substrate which includes an insulating substrate and a plurality of electrodes arranged on the insulating substrate;
    an electric potential applying mechanism which selectively applies a first electric potential and a second electric potential to each of the plurality of electrodes, the first electric potential making overlapping areas, of a surface of the pattern forming substrate, which overlap with the plurality of electrodes respectively, have a first liquid repellent property, and the second electric potential making the overlapping areas have a second liquid repellent property which is lower than the first liquid repellent property;
    a liquid supplying mechanism which supplies, to the surface of the pattern forming substrate, a first amount of the electroconductive liquid having an original pattern with a shape which is different from a shape of the predetermined pattern;
    an electric potential controller programmed to control the electric potential applying mechanism so as to apply the second electric potential to certain electrodes, among the plurality of electrodes, corresponding to the pattern, and to apply the first electric potential to other electrodes, among the plurality of electrodes, not overlapping with the pattern so as to move the first amount of the electroconductive liquid to form the predetermined pattern on the surface of the pattern forming substrate; and
    a transferring mechanism which transfers, to the printing medium, the first amount of the electroconductive liquid which is arranged to form the predetermined pattern on the surface of the pattern forming substrate, by bringing the first amount of the electroconductive liquid into contact with the printing medium.

2. The pattern forming apparatus according to claim 1; wherein the plurality of electrodes are mutually isolated on the substrate, are arranged in a regular manner, and have shapes which are same among the electrodes.

3. The pattern forming apparatus according to claim 2; wherein the electric potential controller is further programmed to apply the first electric potential to the certain electrodes corresponding to the pattern after the transferring mechanism brings the first amount of the electroconductive liquid arranged to form the pattern into contact with the printing substrate.

4. The pattern forming apparatus according to claim 2; wherein the first liquid repellent property of the overlapping areas corresponding to the certain electrodes, to which the first electric potential is applied by the electric potential applying mechanism, is greater than a liquid repellent property of the printing medium.

5. The pattern forming apparatus according to claim 2; wherein the electric potential controller is further programmed to control the electric potential applying mechanism to apply the second electric potential to intermediate pattern-electrodes, among the plurality of electrodes, corresponding to an intermediate pattern, and to apply the first electric potential to non-overlapping electrodes, among the plurality of electrodes, not overlapping with the intermediate pattern before the electric potential controller controls the electric potential applying mechanism to arrange the first amount of the electroconductive liquid to form the pattern on the surface of the pattern forming substrate, the intermediate pattern having an intermediate shape between the initial pattern and the pattern.

6. The pattern forming apparatus according to claim 5; wherein a through hole is formed through the pattern forming substrate, the through hole having an opening on the surface of the pattern forming substrate; and
wherein the liquid supplying mechanism supplies, via the through hole, the first amount of the electroconductive liquid to the surface of the pattern forming substrate.

7. The pattern forming apparatus according to claim 1; wherein the electric potential controller is further programmed to control the electric potential applying mechanism to apply the second electric potential to a initial pattern-electrodes, among the plurality of electrodes, corresponding to a predetermined initial pattern and to apply the first electric potential to non-overlapping electrodes, among the plurality of electrodes, not overlapping with the initial pattern so as to arrange the electroconductive liquid, supplied to the surface of the pattern forming substrate by the liquid supplying mechanism, to form the initial pattern.

8. The pattern forming apparatus according to claim 1; wherein the electric potential controller is further programmed to control the electric potential applying mechanism to apply the second electric potential to a group of electrodes, located at a central portion among the plurality of electrodes, and to apply the first electric potential to remaining electrodes, not belonging to the group of electrodes, so that the first amount of the electroconductive liquid is arranged to form the initial pattern.

9. The pattern forming apparatus according to claim 1; wherein the liquid supplying mechanism is configured to supply the first amount of the electroconductive liquid in a supply amount in accordance with the pattern; and
wherein the electric potential controller is configured further programmed to control the electric potential applying mechanism such that a number of the initial pattern-electrodes to which the second electric potential is applied is increased when the supply amount of the electroconductive liquid is increased, and that a number of the non-overlapping electrodes to which the first electric potential is applied is decreased when the supply amount of the electroconductive liquid is increased.

10. The pattern forming apparatus according to claim 2; wherein the pattern forming substrate further includes an insulating layer which covers the plurality of electrodes.

11. The pattern forming apparatus according to claim 10;
wherein a through hole is formed in the pattern forming substrate, the through hole penetrating through the substrate and the insulating layer, and having an opening on the insulating layer.

12. The pattern forming apparatus according to claim 1;
wherein the plurality of electrodes are arranged on the substrate in a matrix form.

13. The pattern forming apparatus according to claim 1;
wherein each of the plurality of electrodes is a flat plate, and the electrodes are arranged in the same plane.

14. The pattern forming apparatus according to claim 1;
wherein a plurality of recesses is formed in the substrate; and
wherein the electrodes are formed in a recessed shape corresponding to the recesses, respectively.

15. The pattern forming apparatus according to claim 1, further comprising:
a movable mechanism which has the pattern forming substrate provided thereon, and which is movable between the liquid supplying mechanism and the transferring mechanism.

* * * * *